(12) United States Patent
Tanaka et al.

(10) Patent No.: US 9,966,249 B2
(45) Date of Patent: May 8, 2018

(54) SILICON CARBIDE SEMICONDUCTOR SUBSTRATE AND METHOD FOR MANUFACTURING SAME

(71) Applicant: Sumitomo Electric Industries, Ltd., Osaka-shi (JP)

(72) Inventors: So Tanaka, Osaka (JP); Kyoko Okita, Itami (JP); Taro Nishiguchi, Itami (JP); Ryosuke Kubota, Osaka (JP); Kenji Kanbara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days. days.

(21) Appl. No.: 15/024,110

(22) PCT Filed: Aug. 11, 2014

(86) PCT No.: PCT/JP2014/071166
§ 371 (c)(1),
(2) Date: Mar. 23, 2016

(87) PCT Pub. No.: WO2015/045654
PCT Pub. Date: Apr. 2, 2015

(65) Prior Publication Data
US 2016/0233080 A1    Aug. 11, 2016

(30) Foreign Application Priority Data

Sep. 25, 2013  (JP) .................................. 2013-198210
Jan. 29, 2014  (JP) .................................. 2014-014412

(51) Int. Cl.
*C30B 25/18*    (2006.01)
*C30B 33/00*    (2006.01)
(Continued)

(52) U.S. Cl.
CPC ...... *H01L 21/02021* (2013.01); *C30B 25/186* (2013.01); *C30B 29/36* (2013.01);
(Continued)

(58) Field of Classification Search
None
See application file for complete search history.

(56) References Cited

U.S. PATENT DOCUMENTS

2006/0225645 A1    10/2006 Powell et al.
2012/0325196 A1    12/2012 Okita et al.
(Continued)

FOREIGN PATENT DOCUMENTS

JP    2008-115037 A    5/2008
JP    2012-214376 A    11/2012
JP    2013-087005 A    5/2013

OTHER PUBLICATIONS

International Search Report in International PCT Application No. PCT/JP2014/071166, dated Sep. 9, 2014.

*Primary Examiner* — Erik Kielin
(74) *Attorney, Agent, or Firm* — Venable LLP; Michael A. Sartori; Laura G. Remus

(57) ABSTRACT

A silicon carbide semiconductor substrate includes a first main surface and a second main surface opposite to the first main surface. The first main surface has a maximum diameter of more than 100 mm, and the silicon carbide semiconductor substrate has a thickness of not more than 700 μm. A dislocation density is not more than 500/mm² at an arbitrary region having an area of 1 mm² in a region within 5 mm from an outer circumferential end portion of the first main surface toward a center of the first main surface. Accordingly, there is provided a silicon carbide semiconductor substrate allowing for suppression of generation of cracks.

18 Claims, 10 Drawing Sheets

(51) Int. Cl.
*C30B 29/36* (2006.01)
*H01L 29/04* (2006.01)
*H01L 29/16* (2006.01)
*H01L 21/02* (2006.01)
*C30B 23/00* (2006.01)
*H01L 29/06* (2006.01)

(52) U.S. Cl.
CPC ........ *C30B 33/00* (2013.01); *H01L 21/02378* (2013.01); *H01L 21/02433* (2013.01); *H01L 29/045* (2013.01); *H01L 29/1608* (2013.01); *C30B 23/00* (2013.01); *H01L 21/02529* (2013.01); *H01L 29/0657* (2013.01)

(56) References Cited

U.S. PATENT DOCUMENTS

2013/0071643 A1* 3/2013 Harada .................. C30B 29/36
 428/220
2013/0095285 A1 4/2013 Sasaki et al.
2014/0117380 A1* 5/2014 Loboda ............. H01L 21/30625
 257/77

* cited by examiner

SILICON CARBIDE SEMICONDUCTOR SUBSTRATE AND METHOD FOR MANUFACTURING SAME

TECHNICAL FIELD

The present invention relates to a silicon carbide semiconductor substrate and a method for manufacturing the silicon carbide semiconductor substrate, particularly, a silicon carbide semiconductor substrate allowing for suppression of generation of cracks, and a method for manufacturing the silicon carbide semiconductor substrate.

BACKGROUND ART

In recent years, in order to attain high breakdown voltage, low loss, use under high temperature environment, and the like in a semiconductor device such as a MOSFET (Metal Oxide Semiconductor Field Effect Transistor), silicon carbide has begun to be employed as a material of a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on resistance, and the like. Further, the semiconductor device thus adopting silicon carbide as its material has characteristics less deteriorated even under a high temperature environment than those of a semiconductor device adopting silicon as its material, advantageously.

For example, Japanese Patent Laying-Open No. 2012-214376 (Patent Document 1) describes a method for manufacturing a silicon carbide wafer having a distortion of less than 5 μm, a warpage of less than 5 μm, an entire thickness fluctuation of less than 2.0 μm, and a diameter of 75 mm. According to the method for manufacturing the silicon carbide wafer, a silicon carbide boule is sliced into the form of a wafer, and then the silicon carbide wafer is lapped while restricting lapping downward force to be less than downward force bending the wafer.

CITATION LIST

Patent Document

PTD 1: Japanese Patent Laying-Open No. 2012-214376

SUMMARY OF INVENTION

Technical Problem

However, in recent years, cracks are frequently generated in a silicon carbide semiconductor substrate in a process of manufacturing a silicon carbide semiconductor device using the silicon carbide semiconductor substrate. For example, when holding the silicon carbide semiconductor substrate by way of an electrostatic chuck method, cracks may be generated in the silicon carbide semiconductor substrate in an ion implantation step of implanting an impurity dopant, a CVD apparatus for forming an oxide film and a nitride film, a sputtering step of forming a metal film, and a heat treatment step of performing sintering, activation annealing, and alloying annealing for electrode.

As described in Japanese Patent Laying-Open No. 2012-214376, when the diameter of the silicon carbide semiconductor substrate is about 75 mm, cracks are unlikely to be generated in the silicon carbide semiconductor substrate. However, for example, cracks are frequently generated in a silicon carbide semiconductor substrate having a large diameter of about more than 100 mm, so that the cracks are required to be suppressed from being generated in the silicon carbide semiconductor substrate.

The present invention has been made to solve the above problem, and has an object to provide a silicon carbide semiconductor substrate allowing for suppression of generation of cracks, and a method for manufacturing the silicon carbide semiconductor substrate.

Solution to Problem

A silicon carbide semiconductor substrate according to the present invention includes a first main surface and a second main surface opposite to the first main surface. The first main surface has a maximum diameter of more than 100 mm, and the silicon carbide semiconductor substrate has a thickness of not more than 700 μm. A dislocation density is not more than 500/mm$^2$ at an arbitrary region having an area of 1 mm$^2$ in a region within 5 mm from an outer circumferential end portion of the first main surface toward a center of the first main surface.

A method for manufacturing a silicon carbide semiconductor substrate according to the present invention includes the following steps. There is prepared a silicon carbide semiconductor substrate having a first main surface and a second main surface opposite to the first main surface, the first main surface having a maximum diameter of more than 100 mm, the silicon carbide semiconductor substrate having a thickness of not more than 700 μm. A circumferential edge portion of the silicon carbide semiconductor substrate is removed. In the step of removing the circumferential edge portion, the circumferential edge portion is removed such that a position of a first center of the first main surface of the silicon carbide semiconductor substrate before removing the circumferential edge portion does not match with a position of a second center of the first main surface of the silicon carbide semiconductor substrate after removing the circumferential edge portion, and such that the second center is located in the first main surface at a region within 15° relative to a straight line obtained by projecting, on the first main surface, a straight line passing through the first center and parallel to a <1-100> direction when viewed from the first center.

Advantageous Effects of Invention

According to the present invention, there can be provided a silicon carbide semiconductor substrate allowing for suppression of generation of cracks, and a method for manufacturing the silicon carbide semiconductor substrate.

DESCRIPTION OF EMBODIMENTS

Figure 1:
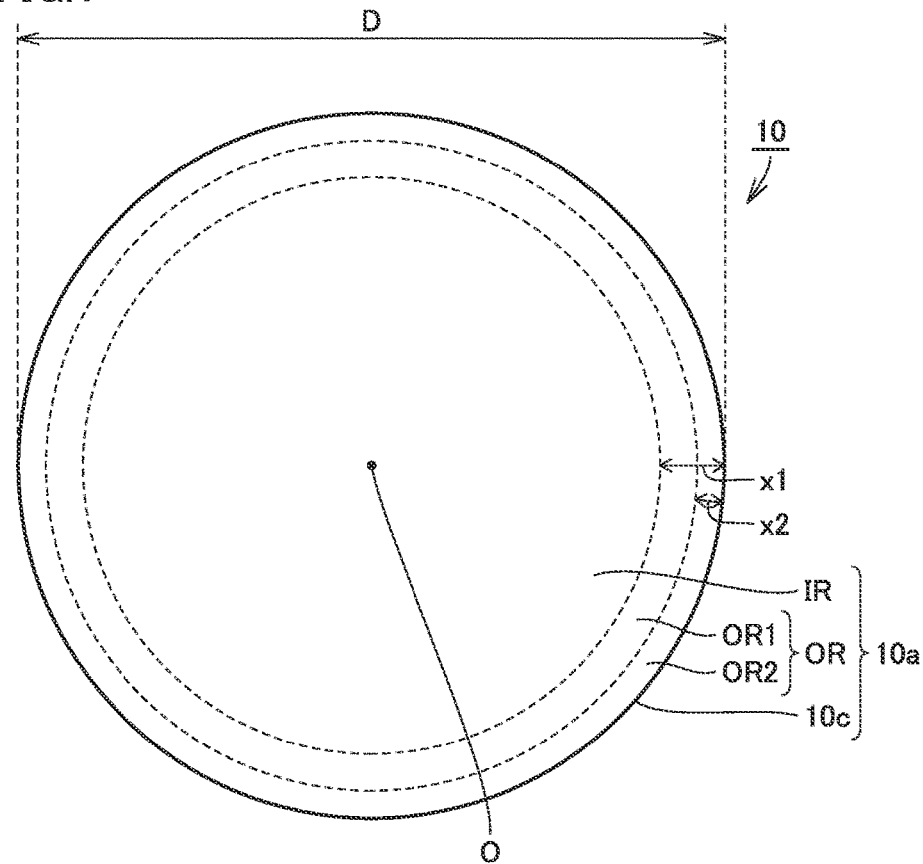
FIG. 1 is a schematic plan view for schematically illustrating a structure of a silicon carbide semiconductor substrate according to one embodiment of the present invention.

[Description of Embodiment of the Invention of the Present Application]

The following describes an embodiment of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360° is employed.

As a result of diligently studying a method for suppressing generation of cracks in a silicon carbide semiconductor substrate, the inventors obtained the following knowledge and arrived at the present invention.

In recent years, a silicon carbide semiconductor substrate tends to have a surface with a larger diameter and to have a smaller thickness. When the diameter of the surface becomes larger and the thickness becomes smaller, the silicon carbide semiconductor substrate is more likely to be cracked. When a silicon carbide semiconductor substrate has a surface with a maximum diameter of more than 100 mm and has a thickness of not more than 700 μm, cracks are notably generated in the silicon carbide semiconductor substrate.

It was revealed that the generation of cracks in the silicon carbide semiconductor substrate is associated with a dislocation density in a region within a certain distance from the outer circumferential end portion of the silicon carbide semiconductor substrate toward the center of the first main surface. As a result of more detailed research, it was found that in a silicon carbide semiconductor substrate having a first main surface with a maximum diameter of more than 100 mm and having a thickness of not more than 700 μm, generation of cracks can be suppressed effectively by providing a dislocation density of not more than $500/mm^2$ at an arbitrary region having an area of 1 $mm^2$ in a region within 5 mm from the outer circumferential end portion of the first main surface toward the center of the first main surface.

Moreover, in a substrate formed of silicon carbide single crystal, there is such a characteristic that stacking faults are more frequently generated in a <1-100> direction as compared with those in a <11-20> direction. In a bulk crystal growth plane, there is such a characteristic that the off angle of a growth surface becomes larger as a distance from the c plane facet becomes larger. When the off angle becomes larger, step-bunching is likely to take place. As the step-bunching is larger, conversion from threading dislocation to basal plane dislocation is more likely to take place. The conversion from threading dislocation to basal plane dislocation is a defect-generating phenomenon intrinsic to silicon carbide. In comparison between the <11-20> direction and the <1-100> direction, the step-bunching is more likely to take place in the <1-100> direction. Hence, the conversion from threading dislocation to basal plane dislocation is more likely to take place particularly in a region having a large distance from the facet in the <1-100> direction. Here, it is considered that stacking faults are likely to particularly generated in the <1-100> direction since expansion from basal plane dislocation to stacking fault takes place due to distortion during cooling or the like.

(1) A silicon carbide semiconductor substrate 10 according to an embodiment includes a first main surface 10a and a second main surface 10b opposite to first main surface 10a. First main surface 10a has a maximum diameter of more than 100 mm, and silicon carbide semiconductor substrate 10 has a thickness of not more than 700 μm. A dislocation density is not more than $500/mm^2$ at an arbitrary region having an area of 1 $mm^2$ in a region within 5 mm from an outer circumferential end portion 10c of first main surface 10a toward a center O of first main surface 10a. Accordingly, cracks can be suppressed from being generated in the silicon carbide semiconductor substrate. As a result, silicon carbide semiconductor elements can be manufactured using the silicon carbide semiconductor substrate at an industrially adequate yield.

(2) Preferably in silicon carbide semiconductor substrate 10 according to (1), when at least either of one or more crystal grain boundaries and one or more dislocation arrays exist in a region of 1 mm from outer circumferential end portion 10c of first main surface 10a toward the center of first main surface 10a, the dislocation density is not more than 200/mm$^2$ at the arbitrary region having an area of 1 mm$^2$ in the region within 5 mm from outer circumferential end portion 10c of first main surface 10a toward center O of first main surface 10a. When neither of the crystal grain boundaries and the dislocation arrays exist in the region of 1 mm from outer circumferential end portion 10c of first main surface 10a toward center O of first main surface 10a, the dislocation density is not more than 500/mm$^2$ at the arbitrary region having an area of 1 mm$^2$ in the region within 5 mm from outer circumferential end portion 10c of first main surface 10a toward center O of first main surface 10a.

With more detailed research, it was found that when at least either of one or more crystal grain boundaries and one or more dislocation arrays exist in the region of 1 mm from outer circumferential end portion 10c of first main surface 10a toward center O of first main surface 10a, silicon carbide semiconductor substrate 10 is more likely to be cracked as compared with a case where neither of the crystal grain boundaries and the dislocation arrays exist in the region. Hence, when at least either of one or more crystal grain boundaries and one or more dislocation arrays exist in the region of 1 mm from outer circumferential end portion 10c of first main surface 10a toward center O of first main surface 10a, cracks can be suppressed effectively in the silicon carbide semiconductor substrate by providing a dislocation density of not more than 200/mm$^2$ at an arbitrary region having an area of 1 mm$^2$ in the region within 5 mm from outer circumferential end portion 10c of first main surface 10a toward center O of first main surface 10a.

(3) Preferably in silicon carbide semiconductor substrate 10 according to (1), the dislocation density is not more than 200/mm$^2$ at the arbitrary region having an area of 1 mm$^2$ in the region within 5 mm from outer circumferential end portion 10c of first main surface 10a toward center O of first main surface 10a. Accordingly, the silicon carbide semiconductor substrate can be suppressed effectively from being cracked.

(4) Preferably in silicon carbide semiconductor substrate 10 according to (3), when at least either of one or more crystal grain boundaries and one or more dislocation arrays exist in a region of 1 mm from outer circumferential end portion 10c of first main surface 10a toward center O of first main surface 10a, the dislocation density is not more than 100/mm$^2$ at the arbitrary region having an area of 1 mm$^2$ in the region within 5 mm from outer circumferential end portion 10c of first main surface 10a toward center O of first main surface 10a. When neither of the crystal grain boundaries and the dislocation arrays exist in the region of 1 mm from outer circumferential end portion 10c of first main surface 10a toward center O of first main surface 10a, the dislocation density is not more than 200/mm$^2$ at the arbitrary region having an area of 1 mm$^2$ in the region within 5 mm from outer circumferential end portion 10c of first main surface 10a toward center O of first main surface 10a. Accordingly, the silicon carbide semiconductor substrate can be suppressed more effectively from being cracked.

(5) Preferably in silicon carbide semiconductor substrate 10 according to (1), the dislocation density is not more than 500/mm$^2$ at an arbitrary region having an area of 1 mm$^2$ in a region within 10 mm from outer circumferential end portion 10c of first main surface 10a toward center O of first main surface 10a. Accordingly, the silicon carbide semiconductor substrate can be suppressed effectively from being cracked.

(6) Preferably in silicon carbide semiconductor substrate 10 according to (5), when at least either of one or more crystal grain boundaries and one or more dislocation arrays exist in a region of 1 mm from outer circumferential end portion 10c of first main surface 10a toward center O of first main surface 10a, the dislocation density is not more than 200/mm$^2$ at the arbitrary region having an area of 1 mm$^2$ in the region within 10 mm from outer circumferential end portion 10c of first main surface 10a toward center O of first main surface 10a. When neither of the crystal grain boundaries and the dislocation arrays exist in the region of 1 mm from outer circumferential end portion 10c of first main surface 10a toward center O of first main surface 10a, the dislocation density is not more than 500/mm$^2$ at the arbitrary region having an area of 1 mm$^2$ in the region within 10 mm from outer circumferential end portion 10c of first main surface 10a toward center O of first main surface 10a.

With more detailed research, it was found that when at least either of one or more crystal grain boundaries and one or more dislocation arrays exist in the region of 1 mm from outer circumferential end portion 10c of first main surface 10a toward center O of first main surface 10a, the silicon carbide semiconductor substrate is more likely to be cracked as compared with a case where neither of the crystal grain boundaries and the dislocation arrays exist in the region. Hence, when at least either of one or more crystal grain boundaries and one or more dislocation arrays exist in the region of 1 mm from outer circumferential end portion 10c of first main surface 10a toward center O of first main surface 10a, cracks can be suppressed effectively in the silicon carbide semiconductor substrate by providing a dislocation density of not more than 200/mm$^2$ at an arbitrary region having an area of 1 mm$^2$ in the region within 10 mm from outer circumferential end portion 10c of first main surface 10a toward center O of first main surface 10a.

(7) Preferably in silicon carbide semiconductor substrate 10 according to (5), the dislocation density is not more than 200/mm$^2$ at the arbitrary region having an area of 1 mm$^2$ in the region within 10 mm from outer circumferential end portion 10c of first main surface 10a toward center O of first main surface 10a. Accordingly, the silicon carbide semiconductor substrate can be suppressed more effectively from being cracked.

(8) Preferably in silicon carbide semiconductor substrate 10 according to (7), when at least either of one or more crystal grain boundaries and one or more dislocation arrays exist in a region of 1 mm from outer circumferential end portion 10c of first main surface 10a toward center O of first main surface 10a, the dislocation density is not more than 100/mm$^2$ at the arbitrary region having an area of 1 mm$^2$ in the region within 10 mm from outer circumferential end portion 10c of first main surface 10a toward center O of first main surface 10a. When neither of the crystal grain boundaries and the dislocation arrays exist in the region of 1 mm from outer circumferential end portion 10c of first main surface 10a toward center O of first main surface 10a, the dislocation density is not more than 200/mm$^2$ at the arbitrary region having an area of 1 mm$^2$ in the region within 10 mm from outer circumferential end portion 10c of first main surface 10a toward center O of first main surface 10a. Accordingly, the silicon carbide semiconductor substrate can be suppressed more effectively from being cracked.

(9) Preferably in silicon carbide semiconductor substrate 10 according to any one of (1) to (8), silicon carbide semiconductor substrate 10 includes: a silicon carbide single crystal substrate 11 that constitutes second main surface 10b; and a silicon carbide epitaxial layer 12 that is provided on silicon carbide single crystal substrate 11 and that constitutes first main surface 10a. Accordingly, the silicon carbide semiconductor substrate having the silicon carbide epitaxial layer and the silicon carbide single crystal substrate can be suppressed from being cracked.

(10) Preferably in silicon carbide semiconductor substrate 10 according to any one of (1) to (9), the maximum diameter of first main surface 10a is not less than 150 mm. The silicon carbide semiconductor substrate is more likely to be cracked as the maximum diameter of the first main surface becomes larger. It is possible to particularly effectively suppress cracks in the large-diameter silicon carbide semiconductor substrate with the first main surface having a maximum diameter of not less than 150 mm.

(11) Preferably in silicon carbide semiconductor substrate 10 according to any one of (1) to (10), the thickness of silicon carbide semiconductor substrate 10 is not more than 600 μm. The silicon carbide semiconductor is more likely to be cracked when the silicon carbide semiconductor has a larger diameter and a thinner thickness. The silicon carbide semiconductor substrate having a large diameter and a thin thickness of not more than 600 μm can be particularly effectively suppressed from being cracked.

(12) A method for manufacturing a silicon carbide semiconductor substrate 10 according to the embodiment includes the following steps. There is prepared a silicon carbide semiconductor substrate 11 having a first main surface 11d and a second main surface 11e opposite to first main surface 11d, first main surface 11d having a maximum diameter of more than 100 mm, silicon carbide semiconductor substrate 11 having a thickness of not more than 700 μm. A circumferential edge portion 7 of silicon carbide semiconductor substrate 11 is removed. In the step of removing circumferential edge portion 7, circumferential edge portion 7 is removed such that a position of a first center 11c of first main surface 11d of silicon carbide semiconductor substrate 11 before removing circumferential edge portion 7 does not match with a position of a second center O of first main surface 11d of silicon carbide semiconductor substrate 11 after removing circumferential edge portion 7, and such that second center O is located in first main surface 11d at a region within 15° relative to a straight line obtained by projecting, on the first main surface, a straight line passing through first center 11c and parallel to a <1-100> direction when viewed from first center 11c. The stacking faults are generated more frequently in the <1-100> direction as compared with those in the <11-20> direction. Hence, the stacking faults can be effectively removed by removing circumferential edge portion 7 such that the position of first center 11c of first main surface 11d of silicon carbide semiconductor substrate 11 before removing circumferential edge portion 7 does not match with the position of second center O of first main surface 11d of silicon carbide semiconductor substrate 11 after removing circumferential edge portion 7, and such that second center O is located in first main surface 11d at the region within 15° relative to the straight line obtained by projecting, on the first main surface, the straight line passing through first center 11c and parallel to the <1-100> direction when viewed from first center 11c. As a result, the silicon carbide semiconductor substrate can be suppressed from being cracked.

(13) Preferably, the method for manufacturing silicon carbide semiconductor substrate 10 according to (12) further includes a step of specifying a region 6 having a stacking fault by observing first main surface 11d of silicon carbide semiconductor substrate 11, after the step of preparing silicon carbide semiconductor substrate 11 and before the step of removing circumferential edge portion 7 of silicon carbide semiconductor substrate 11. In the step of removing circumferential edge portion 7, region 6 having the stacking fault is removed. Accordingly, the stacking fault can be removed more effectively.

(14) In the method for manufacturing silicon carbide semiconductor substrate 10 according to (12) or (13), in the step of preparing silicon carbide semiconductor substrate 11, at least either of one or more crystal grain boundaries and one or more dislocation arrays may exist in first main surface 11d of silicon carbide semiconductor substrate 11. In the step of removing circumferential edge portion 7, circumferential edge portion 7 is removed not to divide either of the crystal grain boundaries and the dislocation arrays. Accordingly, a ratio of generation of cracks can be reduced in the silicon carbide semiconductor substrate.

(15) Preferably in the method for manufacturing silicon carbide semiconductor substrate 10 according to (14), in the step of removing circumferential edge portion 7, circumferential edge portion 7 is removed to remove whole of the crystal grain boundaries or the dislocation arrays in first main surface 11d of silicon carbide semiconductor substrate 11. Accordingly, a ratio of generation of cracks can be effectively reduced in the silicon carbide semiconductor substrate.

(16) Preferably in the method for manufacturing silicon carbide semiconductor substrate 10 according to (14), in the step of removing circumferential edge portion 7, circumferential edge portion 7 is removed such that whole of the crystal grain boundaries or the dislocation arrays in first main surface 11d of silicon carbide semiconductor substrate 11 remains in first main surface 11d. Accordingly, a ratio of generation of cracks can be effectively reduced in the silicon carbide semiconductor substrate.

[Details of Embodiments of the Invention of the Present Application]

First, the following describes a configuration of a silicon carbide semiconductor substrate 10 according to one embodiment of the present invention.

Figure 2:
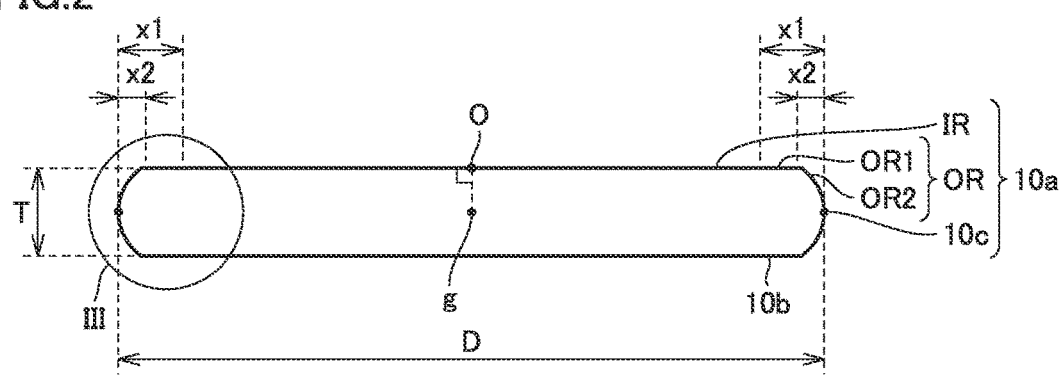
FIG. 2 is a schematic cross sectional view for schematically illustrating the structure of the silicon carbide semiconductor substrate according to the one embodiment of the present invention.

With reference to FIG. 1 and FIG. 2, silicon carbide semiconductor substrate 10 according to the first embodiment is made of, for example, hexagonal silicon carbide single crystal of polytype 4H, and has a first main surface 10a and a second main surface 10b opposite to first main surface 10a. First main surface 10a of silicon carbide semiconductor substrate 10 has a maximum diameter D of 150 mm, for example. Preferably, maximum diameter D of first main surface 10a of silicon carbide semiconductor substrate 10 is larger than 100 mm, more preferably, is not less than 150 mm, and further preferably is not less than 200 mm.

With reference to FIG. 2, silicon carbide semiconductor substrate 10 has a thickness T of not more than 700 μm, preferably, not more than 600 μm. Thickness T of silicon carbide semiconductor substrate 10 is preferably not less than 250 μm and less than 600 μm, is more preferably not less than 300 μm and less than 600 μm, is still more preferably not less than 250 μm and not more than 500 μm, and is further preferably not less than 350 μm and not more than 500 μm. Silicon carbide semiconductor substrate 10 may include nitrogen as an impurity, and may have n type conductivity type, for example.

First main surface 10a of silicon carbide semiconductor substrate 10 includes: a substantially flat inner circumferential region IR including center O of first main surface 10a of silicon carbide semiconductor substrate 10; and an outer circumferential region OR surrounding inner circumferential region IR and including a chamfered portion. With reference to FIG. 2, center O of first main surface 10a is a point at which first main surface 10a crosses a line that is parallel to the normal line of inner circumferential region IR of first main surface 10a and that passes through the center of gravity G of silicon carbide semiconductor substrate 10. First main surface 10a of silicon carbide semiconductor substrate 10 includes an outer circumferential end portion 10c. As with first main surface 10a, second main surface 10b of silicon carbide semiconductor substrate 10 also includes inner circumferential region IR and outer circumferential region OR.

Outer circumferential region OR is a region within a distance x1 from outer circumferential end portion 10c of first main surface 10a toward center O of first main surface 10a, and is a ring-shaped region when viewed in a plan view (field of view in the normal direction of inner circumferential region IR of first main surface 10a). Distance x1 may be 5 mm, or may be 10 mm, for example. Outer circumferential region OR is constituted of: a region (second outer circumferential region OR2) within a distance x2 from outer circumferential end portion 10c of first main surface 10a toward center O of first main surface 10a; and a region (i.e., first outer circumferential region OR1) other than second outer circumferential region OR2 in outer circumferential region OR. Distance x2 is 1 mm, for example.

With reference to FIG. 1 and FIG. 2, inner circumferential region IR of first main surface 10a of silicon carbide semiconductor substrate 10 may be a surface corresponding to a (000-1) plane or a plane angled off by about not more than 8° relative to the (000-1) plane, whereas the inner circumferential region of second main surface 10b may be a surface corresponding to a (0001) plane or a plane angled off by about not more than 8° relative to the (0001) plane.

In outer circumferential region OR within 5 mm from outer circumferential end portion 10c of first main surface 10a of silicon carbide semiconductor substrate 10 according to the present embodiment toward center O of first main surface 10a, the dislocation density is not more than 500/mm² at an arbitrary region having an area of 1 mm². Preferably, in outer circumferential region OR within 5 mm from outer circumferential end portion 10c of first main surface 10a toward center O of first main surface 10a, the dislocation density is not more than 200/mm² at an arbitrary region having an area of 1 mm². Preferably, in outer circumferential region OR within 10 mm from outer circumferential end portion 10c of first main surface 10a toward center O of first main surface 10a, the dislocation density is not more than 500/mm² at an arbitrary region having an area of 1 mm². More preferably, in outer circumferential region OR within 10 mm from outer circumferential end portion 10c of first main surface 10a toward center O of first main surface 10a, the dislocation density is not more than 200/mm² at an arbitrary region having an area of 1 mm².

The number of the dislocations in outer circumferential region OR of first main surface 10a can be counted by forming an etch pit through KOH (potassium hydroxide) etching and observing the etch pit using an optical microscope, for example. Specifically, the etch pit is formed by soaking silicon carbide semiconductor substrate 10 in molten KOH of 515° C. for 8 minutes, for example. The etch pit observed has a diameter of, for example, 50 μm, preferably, not less than 10 μm and not more than 100 μm. Specific types of dislocations observed include: threading screw dislocations, threading edge dislocations, basal plane dislocations, and the like. Preferably, the dislocation density of threading dislocations having a Burgers vector of c+a is not more than 25/mm². Preferably, the dislocation density of threading dislocations having a Burgers vector of c+m is not more than 25/mm². Preferably, the dislocation density of threading edge dislocations having a Burgers vector including no c component is not more than 100/mm², and is more preferably not more than 50/mm². It should be noted that c corresponds to a <0001> orientation, a corresponds to a <11-20> orientation, and m corresponds to a <1-100> orientation.

Figure 3:
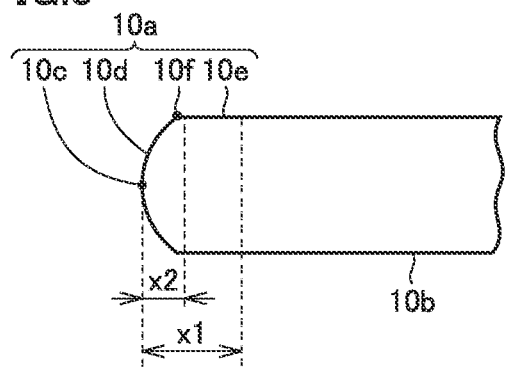
FIG. 3 is an enlarged view of a region III in FIG. 2.

With reference to FIG. 3, first main surface 10a of silicon carbide semiconductor substrate 10 includes: a flat portion 10e; a chamfered portion 10d; a boundary portion 10f, which is a boundary between flat portion 10e and chamfered portion 10d; and an outer circumferential end portion 10c. With reference to FIG. 1 and FIG. 3, second outer circumferential region OR2 may be constituted of chamfered portion 10d, boundary portion 10f, and a portion of flat portion 10e, may be constituted of chamfered portion 10d and boundary portion 10f, or may be constituted of only chamfered portion 10d. First outer circumferential region OR1 may constitute a portion of flat portion 10e.

Figure 4:
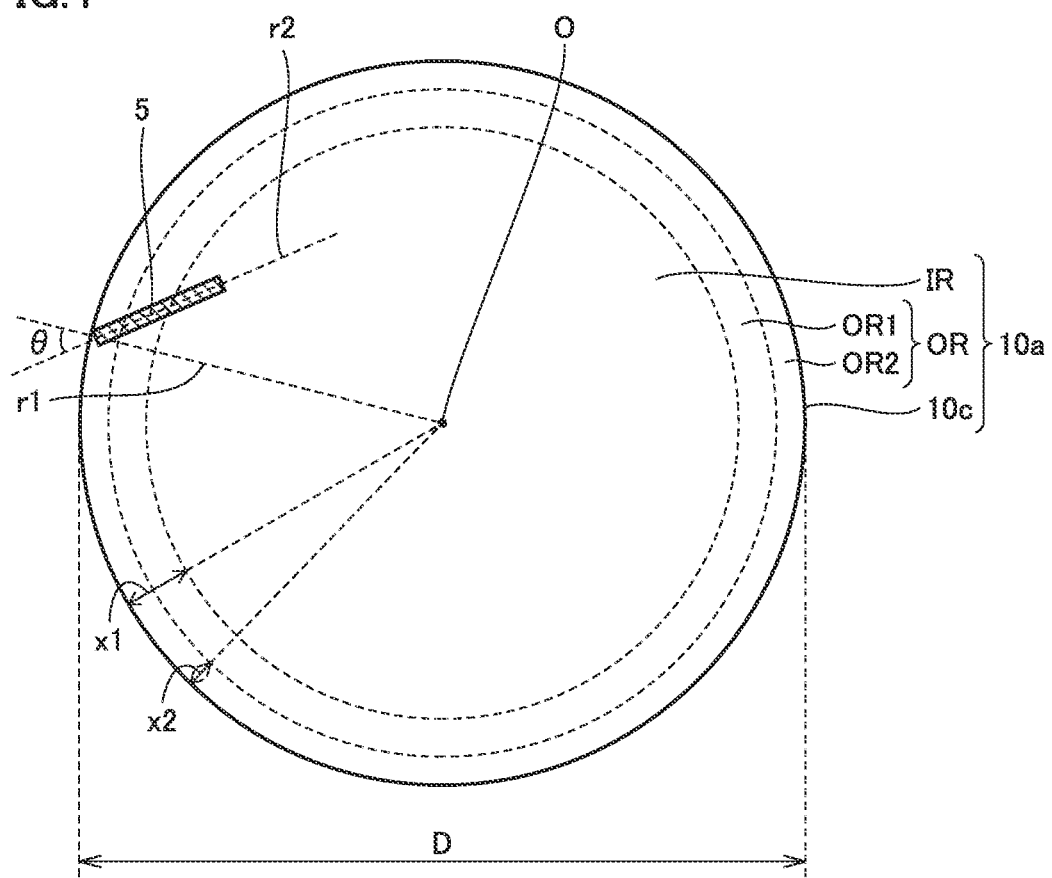
FIG. 4 is a schematic plan view for schematically illustrating a structure of a first modification of the silicon carbide semiconductor substrate according to the one embodiment of the present invention.
Figure 5:
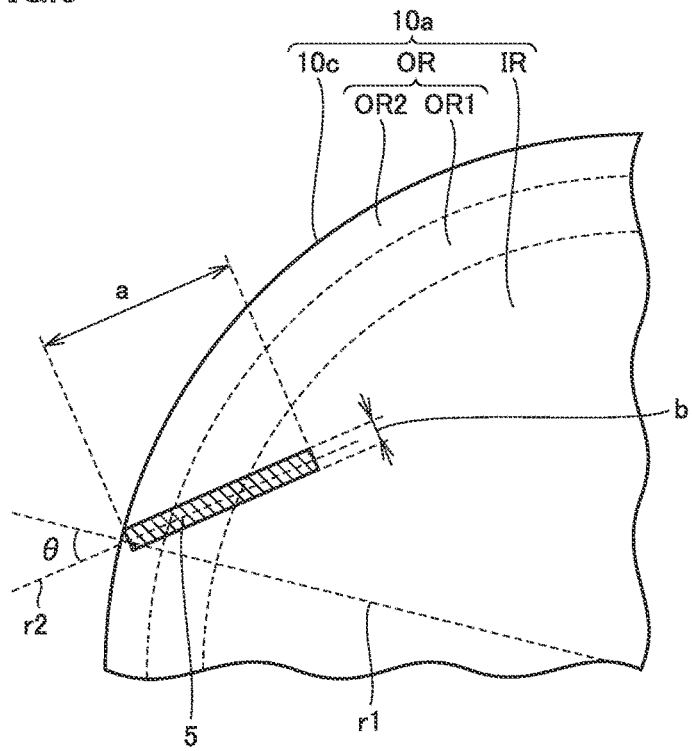
FIG. 5 is a schematic plan view for schematically illustrating a first example of crystal defects generated in a first main surface of the silicon carbide semiconductor substrate.
Figure 6:
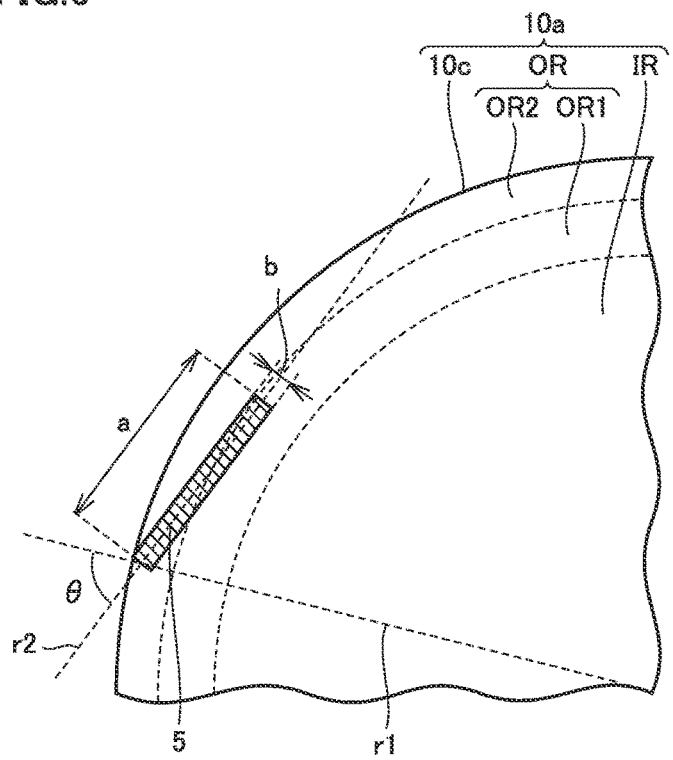
FIG. 6 is a schematic plan view for schematically illustrating a second example of the crystal defects generated in the first main surface of the silicon carbide semiconductor substrate.

With reference to FIG. 4, FIG. 5, and FIG. 6, crystal defects 5 may exist in first main surface 10a of silicon carbide semiconductor substrate 10. Crystal defects 5 refer to, for example, crystal grain boundaries (domain), dislocation arrays (lineage), and the like. Crystal defects 5 such as crystal grain boundaries and dislocation arrays can be fitted with a rectangular shape to determine its length a in the long side direction, its length b in the short side direction, and its area. Preferably, the area of crystal defects 5 such as crystal grain boundaries and dislocation arrays is not more than 3 mm², and length a in the long side direction is not more than 3 mm. More preferably, the area of crystal defects 5 such as crystal grain boundaries and dislocation arrays is not more than 1 mm², and length a in the long side direction is not more than 1 mm. It should be noted that a grain boundary such as a crystal grain boundary can be observed using a polarization microscope, a Nomarski differential interference microscope, and the like, for example. Preferably, the crystal grain boundary is observed by a polarization microscope using crossed Nicols.

Next, the following describes a direction in which crystal defects 5 such as crystal grain boundaries and dislocation arrays extend. As shown in FIG. 4, it is assumed that: a first straight line r1 represents a straight line passing through (i) part of crystal defects 5 at the outermost circumference side of first main surface 10a of silicon carbide semiconductor substrate 10 and (ii) center O of first main surface 10a of silicon carbide semiconductor substrate 10; and a second straight line r2 represents a straight line in the long side direction of crystal defects 5. As shown in FIG. 5, when an angle θ formed by first straight line r1 and second straight line r2 (angle defined to be not more than 90°) is small such as about not more than 45°, crystal defects 5 extend toward inner circumferential region IR of first main surface 10a. Hence, when silicon carbide semiconductor substrate 10 is cracked from crystal defects 5, the crack extends to inner circumferential region IR, thus affecting the semiconductor device formed in inner circumferential region IR. On the other hand, as shown in FIG. 6, when angle θ formed by first straight line r1 and second straight line r2 is large such as about not less than 60°, crystal defects 5 extend within outer circumferential region OR of first main surface 10a and do not extend toward inner circumferential region IR. Hence, when silicon carbide semiconductor substrate 10 is cracked from crystal defects 5, the crack does not extend to inner circumferential region IR, whereby the semiconductor device formed in inner circumferential region IR is hardly affected. That is, in view of yield of semiconductor devices, it is desirable that angle θ formed by first straight line r1 and second straight line r2 is larger. When a ratio obtained by dividing length a of crystal defects 5 in the long side direction by length b thereof in the short side direction is not less than 2, angle θ formed by first straight line r1 and second straight line r2 is preferably more than 45°, and is more preferably not less than 60°.

A case where at least either of one or more crystal grain boundaries and one or more dislocation arrays exist in second outer circumferential region OR2 is intended to include, for example, the following cases: a case where one or more crystal grain boundaries exist in second outer circumferential region OR2; a case where one or more dislocation arrays exist in second outer circumferential region OR2; a case where one or more crystal grain boundaries and one or more dislocation arrays exist in second outer circumferential region OR2; a case where crystal defects 5 such as crystal grain boundaries and dislocation arrays are formed to cross a boundary between first outer circumferential region OR1 and second outer circumferential region OR2; and the like. In the case where at least either of one or more crystal grain boundaries and one or more dislocation arrays exist in second outer circumferential region OR2, the dislocation density of outer circumferential region OR is preferably less than the dislocation density of outer circumferential region OR in the case where neither of the crystal grain boundaries and the dislocation arrays exist in second outer circumferential region OR2. Specifically, when at least either of one or more crystal grain boundaries and one or more dislocation arrays exist in second outer circumferential region OR2 of 1 mm from outer circumferential end portion 10c of first main surface 10a of silicon carbide semiconductor substrate 10 toward center O, the dislocation density is preferably not more than 200/mm$^2$ at an arbitrary region having an area of 1 mm$^2$ in outer circumferential region OR within 5 mm from outer circumferential end portion 10c of first main surface 10a toward center O of first main surface 10a. When neither of the crystal grain boundaries and the dislocation arrays exists in second outer circumferential region OR2 of 1 mm from outer circumferential end portion 10c of first main surface 10a toward center O, the dislocation density is preferably not more than 500/mm$^2$ at the arbitrary region having an area of 1 mm$^2$ in outer circumferential region OR within 5 mm from outer circumferential end portion 10c of first main surface 10a toward center O of first main surface 10a.

More preferably, when at least either of one or more crystal grain boundaries and one or more dislocation arrays exist in second outer circumferential region OR2 of 1 mm from outer circumferential end portion 10c of first main surface 10a toward center O, the dislocation density is not more than 100/mm$^2$ at an arbitrary region having an area of 1 mm$^2$ in outer circumferential region OR within 5 mm from outer circumferential end portion 10c of first main surface 10a toward center O of first main surface 10a. When neither of the crystal grain boundaries and the dislocation arrays exist in second outer circumferential region OR2 of 1 mm from outer circumferential end portion 10c of first main surface 10a toward center O, the dislocation density is more preferably not more than 200/mm$^2$ at the arbitrary region having an area of 1 mm$^2$ in outer circumferential region OR within 5 mm from outer circumferential end portion 10c of first main surface 10a toward center O of first main surface 10a.

Preferably, when at least either of one or more crystal grain boundaries and one or more dislocation arrays exist in a region of 1 mm from outer circumferential end portion 10c of first main surface 10a toward center O, the dislocation density is preferably not more than 200/mm$^2$ at an arbitrary region having an area of 1 mm$^2$ in outer circumferential region OR within 10 mm from outer circumferential end portion 10c of first main surface 10a toward center O of first main surface 10a. When neither of the crystal grain boundaries and the dislocation arrays exist in second outer circumferential region OR2 of 1 mm from outer circumferential end portion 10c of first main surface 10a toward center O, the dislocation density is preferably not more than 500/mm$^2$ at the arbitrary region having an area of 1 mm$^2$ in outer circumferential region OR within 10 mm from outer circumferential end portion 10c of first main surface 10a toward center O of first main surface 10a. More preferably, when at least either of one or more crystal grain boundaries and one or more dislocation arrays exist in second outer circumferential region OR2 of 1 mm from outer circumferential end portion 10c of first main surface 10a toward center O, the dislocation density is not more than 100/mm$^2$ at an arbitrary region having an area of 1 mm$^2$ in outer circumferential region OR within 10 mm from outer circumferential end portion 10c of first main surface 10a toward center O of first main surface 10a. When neither of the crystal grain boundaries and the dislocation arrays exist in second outer circumferential region OR2 of 1 mm from outer circumferential end portion 10c of first main surface 10a toward center O, the dislocation density is more preferably not more than 200/mm$^2$ at the arbitrary region having an area of 1 mm$^2$ in outer circumferential region OR within 10 mm from outer circumferential end portion 10c of first main surface 10a toward center O of first main surface 10a.

Figure 7:
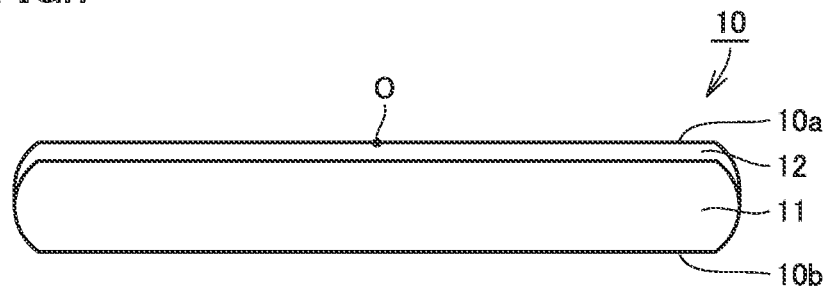
FIG. 7 is a schematic cross sectional view for schematically illustrating a structure of a second modification of the silicon carbide semiconductor substrate according to the one embodiment of the present invention.

With reference to FIG. 7, silicon carbide semiconductor substrate 10 may include: a silicon carbide single crystal substrate 11; and a silicon carbide epitaxial layer 12 provided on silicon carbide single crystal substrate 11. Silicon carbide single crystal substrate 11 constitutes second main surface 10b of silicon carbide semiconductor substrate 10. Silicon carbide epitaxial layer 12 constitutes first main surface 10a of silicon carbide semiconductor substrate 10. Each of silicon carbide single crystal substrate 11 and silicon carbide epitaxial layer 12 includes an impurity such as nitrogen, and has n type conductivity. The impurity concentration of silicon carbide epitaxial layer 12 is preferably less than the impurity concentration of silicon carbide single crystal substrate 11.

It should be noted that silicon carbide semiconductor substrate 10 may be a silicon carbide single crystal substrate 11 having no silicon carbide epitaxial layer 12. Moreover, silicon carbide semiconductor substrate 10 may be a seed crystal 2 used in a method of growing silicon carbide single crystal 1 as described later. Moreover, in the above description, the dislocation density of first main surface 10a of silicon carbide semiconductor substrate 10 has been described; however, second main surface 10b of silicon carbide semiconductor substrate 10 may also have the same dislocation density as that of first main surface 10a.

Next, the following describes a method for manufacturing the silicon carbide semiconductor substrate according to the present embodiment.

Figure 8:
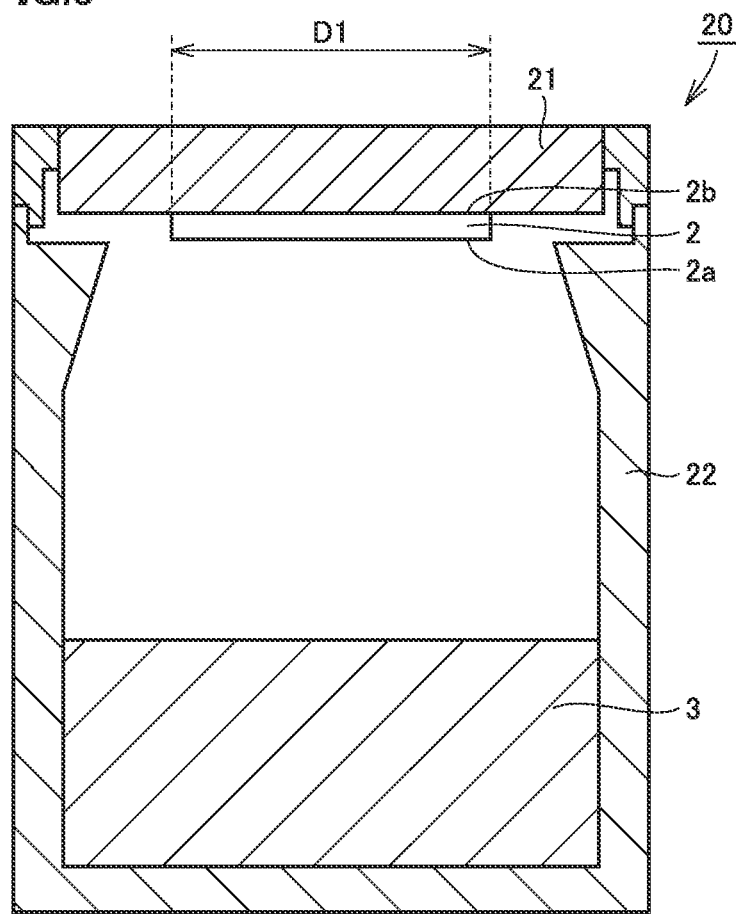
FIG. 8 is a schematic cross sectional view for schematically illustrating a first step of a method for manufacturing the silicon carbide semiconductor substrate according to the one embodiment of the present invention.

First, a crucible 20 serving as a silicon carbide single crystal growth device is prepared. With reference to FIG. 8, for example, crucible 20 is made of graphite, and mainly has a seed crystal holding portion 21 and a source material accommodating portion 22. Seed crystal holding portion 21 is configured to be capable of holding seed crystal 2 made of single-crystal silicon carbide. Source material accommodating portion 22 is configured such that silicon carbide source material 3 constituted of silicon carbide powder can be positioned therein. The crucible has an outer diameter of about 160 mm and an inner diameter of about 120 mm, for example. A heater (not shown) is provided to surround the circumference of the crucible. The heater is an induction heating type coil, a resistance heating type heater, or the like, for example. The heater is configured to be capable of increasing the temperature of silicon carbide source material 3 in source material accommodating portion 22 to a sublimation temperature of silicon carbide.

Next, seed crystal 2 and silicon carbide source material 3 are placed in crucible 20. For example, seed crystal 2 made of hexagonal silicon carbide of polytype 4H is fixed to seed crystal holding portion 21. Seed crystal 2 has a third main surface 2a and a fourth main surface 2b opposite to third main surface 2a. Fourth main surface 2b of seed crystal 2 is in contact with seed crystal holding portion 21 and is held by seed crystal holding portion 21. Silicon carbide source material 3 is accommodated in source material accommodating portion 22. For example, silicon carbide source material 3 is constituted of silicon carbide powder. Silicon carbide source material 3 is placed at source material accommodating portion 22 such that third main surface 2a of seed crystal 2 faces the surface of silicon carbide source material 3. In the manner described above, seed crystal 2 made of silicon carbide single crystal and silicon carbide source material 3 are placed in crucible 20.

Maximum diameter D1 of third main surface 2a of seed crystal 2 is preferably not less than 100 mm, such as 125 mm. Seed crystal 2 is a seed crystal 2 having a dislocation density of not more than 500/mm$^2$ at an arbitrary region having an area of 1 mm$^2$ in outer circumferential region OR within 5 mm from the outer circumferential end portion of third main surface 2a of seed crystal 2 toward center O of third main surface 2a. Preferably, in outer circumferential region OR, the dislocation density is not more than 200/mm$^2$ at the arbitrary region having an area of 1 mm$^2$. The dislocation density of third main surface 2a of seed crystal 2 may be the same as the dislocation density of first main surface 10a of silicon carbide semiconductor substrate 10 mentioned above. Third main surface 2a of seed crystal 2 may correspond to a plane angled off by not more than 10° relative to the (000-1) plane, whereas fourth main surface 2b of seed crystal 2 may correspond to a plane angled off by not more than 10° relative to the (0001) plane, for example.

Next, a first silicon carbide single crystal growing step is performed. Specifically, crucible 20 having silicon carbide source material 3 and seed crystal 2 placed therein is heated from a normal temperature to the sublimation temperature (for example, 2300° C.) of the silicon carbide crystal in an atmospheric gas including helium gas and nitrogen gas, for example. The atmospheric gas may also include argon gas. Seed crystal 2 is heated to have a temperature lower than silicon carbide source material 3. In other words, crucible 20 is heated to have a temperature becoming lower in a direction from silicon carbide source material 3 toward seed crystal 2. Next, pressure in crucible 20 is reduced to 1 kPa, for example. Accordingly, silicon carbide source material 3 in crucible 20 is sublimated and is recrystallized on third main surface 2a of seed crystal 2, thus starting growth of silicon carbide single crystal 1 on third main surface 2a of seed crystal 2. Silicon carbide single crystal 1 is grown for about 100 hours, for example. In this way, silicon carbide single crystal 1 is grown on third main surface 2a of seed crystal 2 (see FIG. 9).

Figure 9:
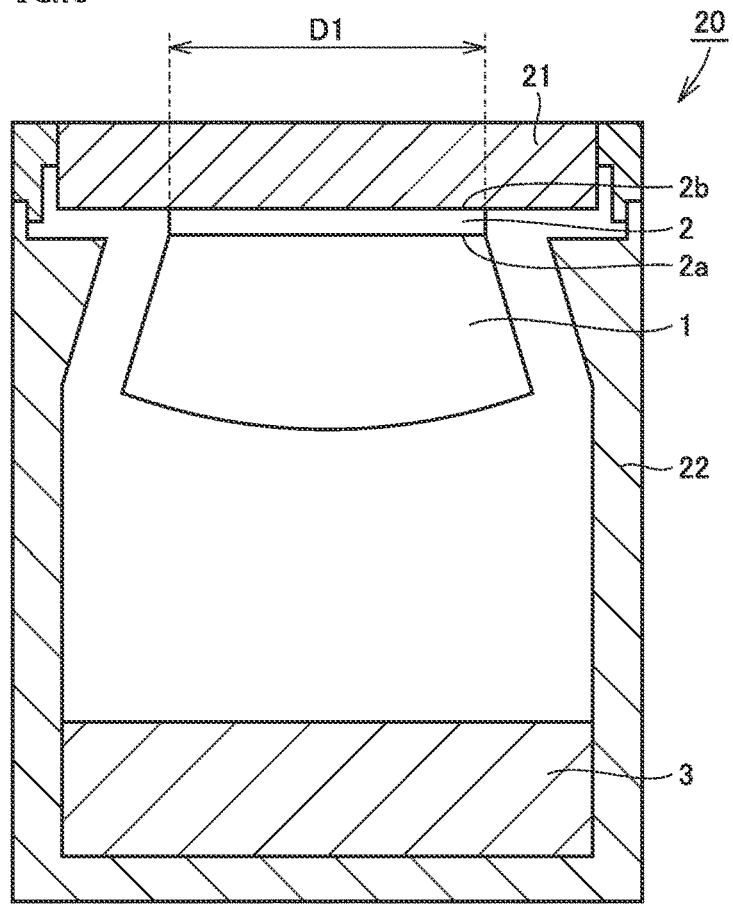
FIG. 9 is a schematic cross sectional view for schematically illustrating a second step of the method for manufacturing the silicon carbide semiconductor substrate according to the one embodiment of the present invention.
Figure 10:
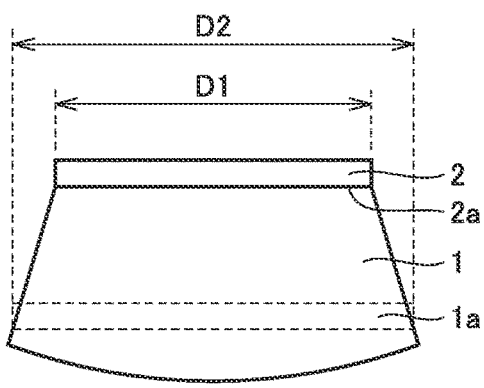
FIG. 10 is a schematic cross sectional view for schematically illustrating a third step of the method for manufacturing the silicon carbide semiconductor substrate according to the one embodiment of the present invention.

As shown in FIG. 9, in the first silicon carbide single crystal growing step, silicon carbide single crystal 1 is grown such that the diameter of silicon carbide single crystal 1 in a direction parallel to third main surface 2a of seed crystal 2 becomes larger than the diameter of third main surface 2a of seed crystal 2. With reference to FIG. 10, after completing the crystal growth of silicon carbide single crystal 1, silicon carbide single crystal 1 and seed crystal 2 are taken out of crucible 20. Maximum diameter D1 of silicon carbide single crystal 1 in the region in contact with third main surface 2a of seed crystal 2 is about 125 mm, for example. The diameter of silicon carbide single crystal 1 becomes larger as it is farther away from third main surface 2a of seed crystal 2. For example, silicon carbide single crystal 1 is sliced, along a plane parallel to third main surface 2a of seed crystal 2, at a position distant away by a certain distance from third main surface 2a of seed crystal 2, thereby obtaining a single-crystal substrate 1a made of silicon carbide single crystal. Single-crystal substrate 1a has a maximum diameter D2 larger than the maximum diameter of third main surface 2a of seed crystal 2, for example. This single-crystal substrate 1a is used as a seed crystal 2 for growing a next silicon carbide single crystal 1.

Figure 11:
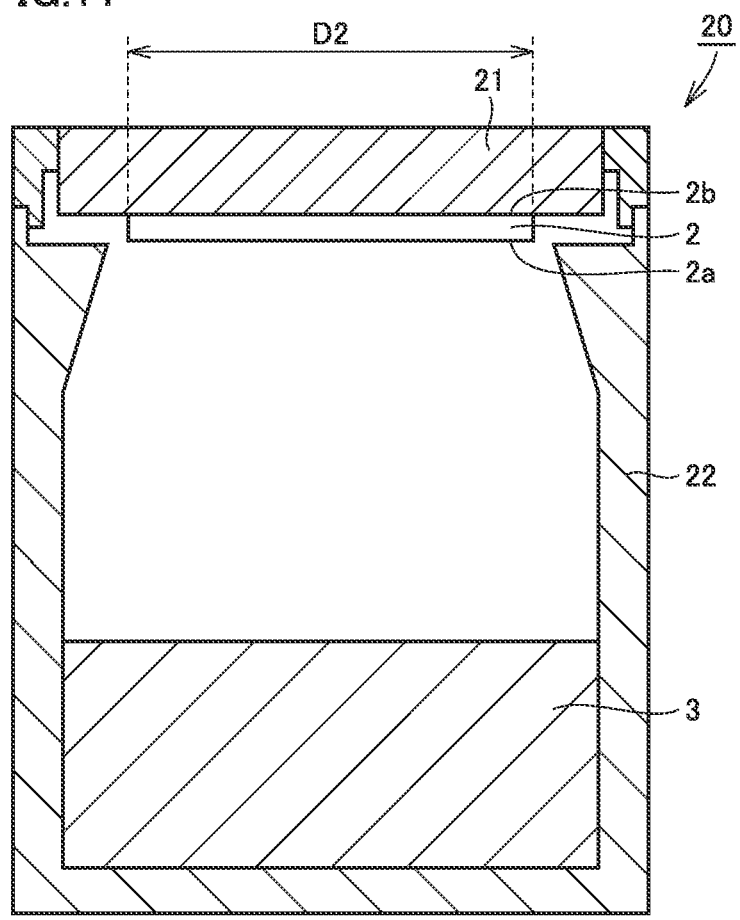
FIG. 11 is a schematic cross sectional view for schematically illustrating a fourth step of the method for manufacturing the silicon carbide semiconductor substrate according to the one embodiment of the present invention.

With reference to FIG. 11, seed crystal 2 constituted of single-crystal substrate 1a is fixed to seed crystal holding portion 21 of crucible 20. Seed crystal 2 has a third main surface 2a and a fourth main surface 2b opposite to third main surface 2a. Fourth main surface 2b of seed crystal 2 is in contact with seed crystal holding portion 21 and is held by seed crystal holding portion 21. Silicon carbide source material 3 is accommodated in source material accommodating portion 22. Silicon carbide source material 3 is constituted of silicon carbide powder, for example. Silicon carbide source material 3 is placed at source material accommodating portion 22 such that third main surface 2a of seed crystal 2 faces the surface of silicon carbide source material 3.

Figure 12:
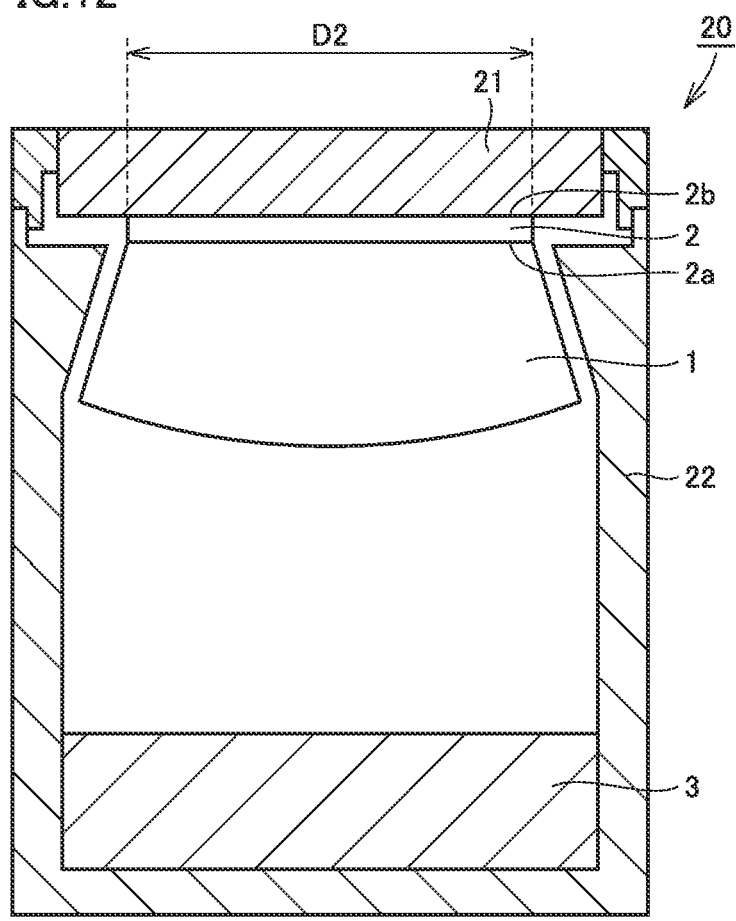
FIG. 12 is a schematic cross sectional view for schematically illustrating a fifth step of the method for manufacturing the silicon carbide semiconductor substrate according to the one embodiment of the present invention.

Next, a second silicon carbide single crystal growing step is performed. Specifically, as with the first silicon carbide single crystal growing step, crucible 20 having silicon carbide source material 3 and seed crystal 2 placed therein is heated from a normal temperature to the sublimation temperature (for example, 2300° C.) of the silicon carbide crystal in an atmospheric gas including helium gas and nitrogen gas, for example. Seed crystal 2 is heated to have a temperature lower than silicon carbide source material 3. In other words, crucible 20 is heated to have a temperature becoming lower in a direction from silicon carbide source material 3 toward seed crystal 2. Next, pressure in crucible 20 is reduced to 1 kPa, for example. Accordingly, silicon carbide source material 3 in crucible 20 is sublimated and is recrystallized on third main surface 2a of seed crystal 2, thus starting growth of silicon carbide single crystal 1 on third main surface 2a of seed crystal 2. Silicon carbide single crystal 1 is grown for about 100 hours, for example. In this way, silicon carbide single crystal 1 is grown on third main surface 2a of seed crystal 2 (see FIG. 12). As shown in FIG. 12, in the second silicon carbide single crystal growing step, silicon carbide single crystal 1 is grown such that the diameter of silicon carbide single crystal 1 in a direction parallel to third main surface 2a of seed crystal 2 becomes larger than the diameter of third main surface 2a of seed crystal 2.

As described above, seed crystal 2 having a small diameter and made of silicon carbide single crystal good in quality to have a low dislocation density is used to grow silicon carbide single crystal 1 having a low dislocation density on third main surface 2a of seed crystal 2 so as to attain a large diameter. Then, a step of cutting a portion of silicon carbide single crystal 1 and using it as a seed crystal 2 for growing a next silicon carbide single crystal 1 to grow a silicon carbide single crystal 1 is repeated. Accordingly, a silicon carbide single crystal 1 having a low dislocation density and a large diameter can be grown. In the end, a silicon carbide single crystal 1 can be obtained which has a maximum diameter larger than 100 mm (preferably, a maximum diameter of not less than 150 mm).

Next, a step of slicing the silicon carbide single crystal is performed. For example, silicon carbide single crystal 1 is sliced by a wire saw. Silicon carbide single crystal 1 is sliced along, for example, a plane crossing the normal line of third main surface 2a of seed crystal 2 (preferably, a plane perpendicular to the normal line), thereby obtaining a plurality of silicon carbide single crystal substrates 11.

Figure 13:
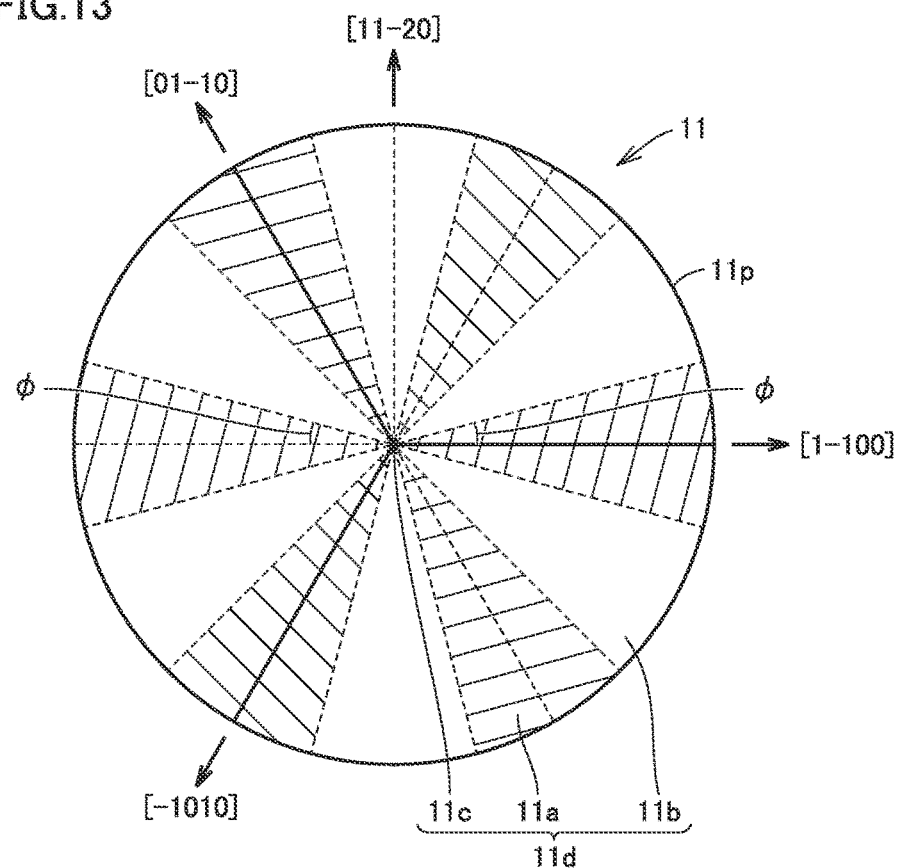
FIG. 13 is a schematic plan view for schematically illustrating a sixth step of the method for manufacturing the silicon carbide semiconductor substrate according to the one embodiment of the present invention.
Figure 14:
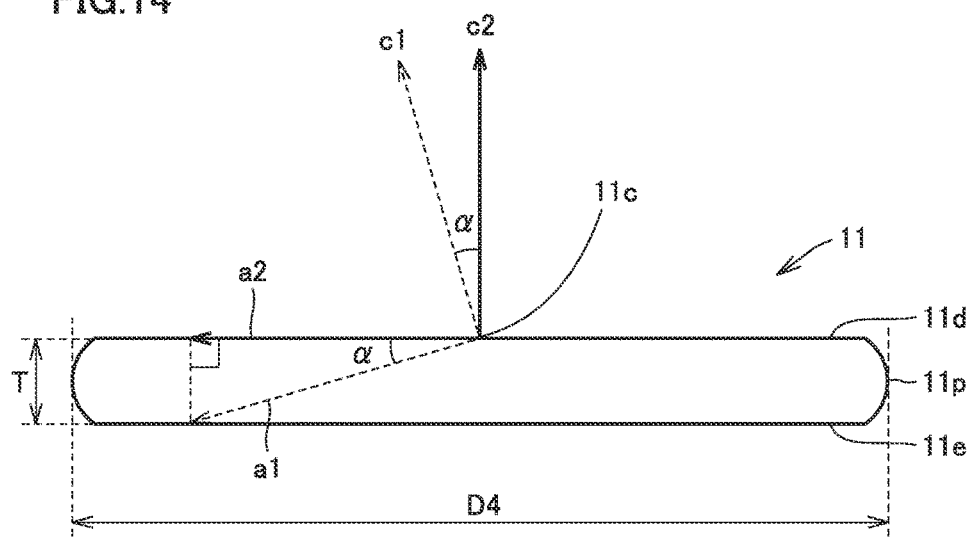
FIG. 14 is a schematic cross sectional view for schematically illustrating the sixth step of the method for manufacturing the silicon carbide semiconductor substrate according to the one embodiment of the present invention.

With reference to FIG. 13 and FIG. 14, silicon carbide single crystal substrate 11 serving as a silicon carbide semiconductor substrate has a first main surface 11d and a second main surface 11e opposite to first main surface 11d. First main surface 11d of silicon carbide single crystal substrate 11 has a maximum diameter D4 larger than 100 mm, preferably, not less than 150 mm. Silicon carbide single crystal substrate 11 has a thickness T of not more than 700 µm, preferably not more than 600 µm. First main surface 11d of silicon carbide single crystal substrate 11 may correspond to the {0001} plane or may correspond to a plane angled off by about not more than 8° relative to the {0001} plane, for example.

In the substrate made of silicon carbide single crystal, stacking faults are likely to be generated in the <1-100> direction in first main surface 11d of silicon carbide single crystal substrate 11, as compared with the <11-20> direction. Specifically, the <1-100> direction refers to a [1-100] direction, a [01-10] direction, and a [−1010] direction. Each of the [1-100] direction, the [01-10] direction, and the [−1010] direction is in a positional relation such that they are shifted from one another by an angle of 120° in first main surface 11d of silicon carbide single crystal substrate 11. The <11-20> direction is in a positional relation such that the <11-20> direction is shifted by an angle of 30° relative to the <1-100> direction. Each of first regions 11a indicated by hatching in FIG. 13 is a region in first main surface 11d of silicon carbide semiconductor substrate 11 within 15° relative to a straight line obtained by projecting, on first main surface 11d, a straight line passing through first center 11c and parallel to the <1-100> direction when viewed from first center 11c of first main surface 11d of silicon carbide semiconductor substrate 11 (in other words, a range of ±15° relative to the straight line obtained by projecting, on first main surface 11d, the straight line parallel to the <1-100> direction). Angle φ in FIG. 13 is 15°. In other words, each of second regions 11b not provided with the hatching in FIG. 13 is a region in first main surface 11d of silicon carbide semiconductor substrate 11 within 15° from a straight line obtained by projecting, on first main surface 11d, a straight line passing through first center 11c and parallel to the <11-20> direction when viewed from first center 11c of first main surface 11d of silicon carbide semiconductor substrate 11 (in other words, a range of ±15° relative to the straight line obtained by projecting, on first main surface 11d, the straight line parallel to the <11-20> direction). First regions 11a indicated by the hatching and second regions 11b not provided with the hatching are provided alternately by every 30° in the circumferential direction of first main surface 11d of silicon carbide semiconductor substrate 11.

With reference to FIG. 14, the following describes the straight line obtained by projecting, on first main surface 11d, the straight line passing through first center 11c of first main surface 11d of silicon carbide single crystal substrate 11 and parallel to the <1-100> direction. First, when the off angle is 0° (that is, when a in FIG. 14 is 0°), first main surface 11d of silicon carbide single crystal substrate 11 corresponds to the {0001} plane, and normal direction c2 of first main surface 11d is the <0001> direction. When the off angle is 0°, the <1-100> direction is a direction a2 parallel to first main surface 11d. Hence, straight line a2 parallel to the <1-100> direction is the straight line obtained by projecting, on first main surface 11d, the straight line passing through first center 11c of first main surface 11d of silicon carbide single crystal substrate 11 and parallel to the <1-100> direction. On the other hand, when the off angle is 8° (that is, a in FIG. 14 is 8°), first main surface 11d of silicon carbide single crystal substrate 11 corresponds to a plane angled off by 8° relative to the {0001} plane, and normal direction c1 of first main surface 11d is a direction inclined by 8° relative to the <0001> direction. When the off angle is 8°, the <1-100> direction is a direction a1, which is inclined by 8° relative to first main surface 11d. Hence, a straight line a2 is the straight line obtained by projecting, on first main surface 11d, straight line a1 passing through first center 11c of first main surface 11d of silicon carbide single crystal substrate 11 and parallel to the <1-100> direction.

Figure 15:
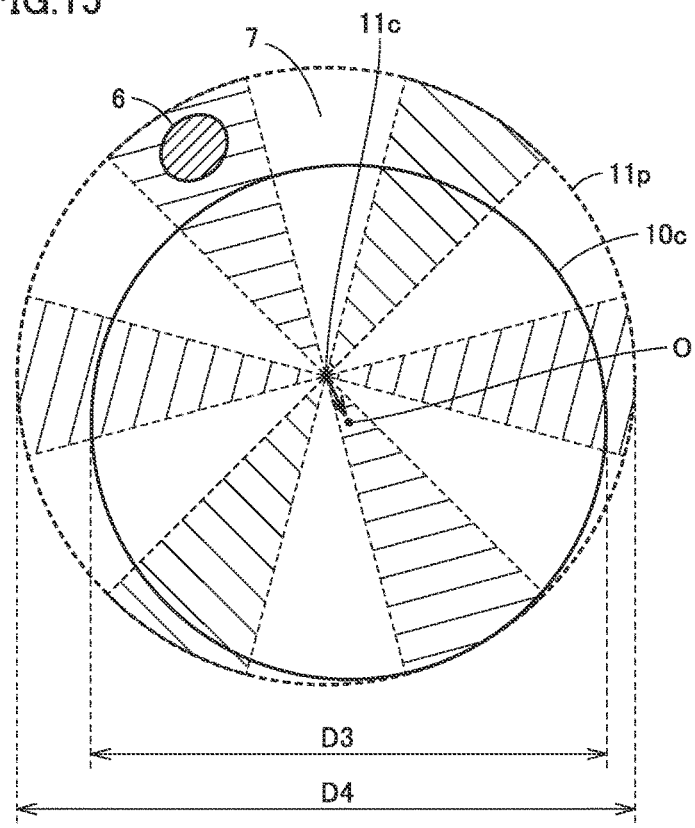
FIG. 15 is a schematic plan view for schematically illustrating a seventh step of the method for manufacturing the silicon carbide semiconductor substrate according to the one embodiment of the present invention.

Next, a step of removing a circumferential edge portion 7 of silicon carbide single crystal substrate 11 is performed. With reference to FIG. 15, in the step of removing circumferential edge portion 7, circumferential edge portion 7 is removed such that the position of first center 11c of first main surface 11d of silicon carbide single crystal substrate 11 before removing circumferential edge portion 7 does not match with the position of second center O of first main surface 11d of silicon carbide single crystal substrate 11 after removing circumferential edge portion 7, and such that second center O is located in first main surface 11d at first region 11a within 15° from the straight line passing through first center 11c and parallel to the <1-100> direction when viewed from first center 11c. In other words, circumferential edge portion 7 of silicon carbide single crystal substrate 11 is chamfered to displace the center of the silicon carbide single crystal substrate 11 such that the position of second center O after removing circumferential edge portion 7 is located in first region 11a indicated by the above-described hatching. Preferably, circumferential edge portion 7 is removed such that second center O is located in first main surface 11d at a region within 10° relative to the straight line passing through first center 11c and parallel to the <1-100> direction when viewed from first center 11c of silicon carbide single crystal substrate 11.

Circumferential edge portion 7 of silicon carbide single crystal substrate 11 is removed by polishing or grinding circumferential edge portion 7 using a grindstone or the like, for example. Preferably, circumferential edge portion 7 of silicon carbide single crystal substrate 11 is removed such that maximum diameter D4 of first main surface 11d of silicon carbide single crystal substrate 11 before removing circumferential edge portion 7 is not less than maximum diameter D3×110%, maximum diameter D3 being the maximum diameter of first main surface 11d of silicon carbide single crystal substrate 11 after removing circumferential edge portion 7.

After the step of preparing silicon carbide semiconductor substrate 11 and before the step of removing circumferential edge portion 7 of silicon carbide semiconductor substrate 11, it is preferable to perform a step of specifying a region 6 having a multiplicity of defects such as stacking faults, crystal grain boundaries, or dislocation arrays by observing first main surface 11d of silicon carbide semiconductor substrate 11. Specifically, optical microscope observation, PL imaging observation, X-ray topography observation, or the like is employed to specify the region having a multiplicity of defects such as stacking faults, crystal grain boundaries, or dislocation arrays. In the step of removing circumferential edge portion 7, region 6 having the stacking faults or the like is removed selectively while performing adjustment to selectively remove the specified region by means of observation with eyes or a camera. For example, by repeating a movement of rotating silicon carbide single crystal substrate 11 clockwise by an angle of less than 360° and then rotating it anticlockwise by the same angle, only the specified portion of circumferential edge portion 7 of silicon carbide semiconductor substrate 11 can be removed selectively.

Figure 16:
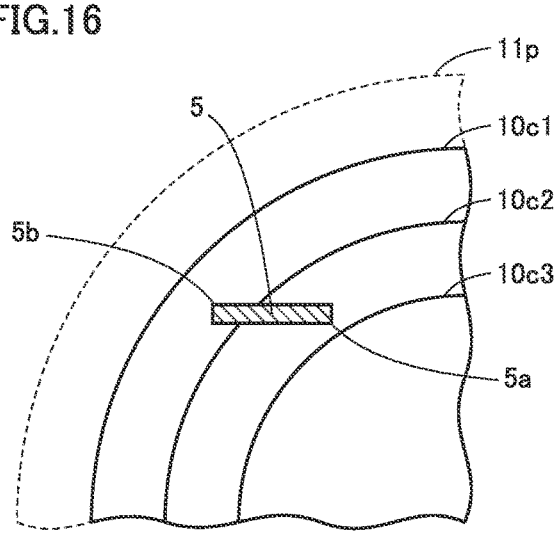
FIG. 16 is a partial schematic enlarged plan view for schematically illustrating the seventh step of the method for manufacturing the silicon carbide semiconductor substrate according to the one embodiment of the present invention.

When at least either of one or more crystal grain boundaries and one or more dislocation arrays exist in first main surface 11d of silicon carbide semiconductor substrate 11, circumferential edge portion 7 is removed not to divide either of the crystal grain boundaries and the dislocation arrays in the step of removing circumferential edge portion 7. Specifically, for example, circumferential edge portion 7 is removed to remove whole of crystal grain boundaries or dislocation arrays in first main surface 11d of silicon carbide semiconductor substrate 11. With reference to FIG. 16, the outer circumferential end portion of silicon carbide single crystal substrate 11 before removing circumferential edge portion 7 is an outer circumferential end portion 11p indicated by a broken line, whereas the outer circumferential end portion of silicon carbide single crystal substrate 11 after removing circumferential edge portion 7 is an outer circumferential end portion 10c3 indicated by a solid line. In this case, in crystal defects 5 such as crystal grain boundaries or dislocation arrays, circumferential edge portion 7 of silicon carbide single crystal substrate 11 is removed such that outer circumferential end portion 10c3 of silicon carbide single crystal substrate 11 after removing circumferential edge portion 7 is located to be close to first center 11c relative to portion 5a nearest to first center 11c of silicon carbide single crystal substrate 11. It should be noted that if the outer circumferential end portion of silicon carbide single crystal substrate 11 after removing circumferential edge portion 7 is located at outer circumferential end portion 10c2, crystal defects 5 such as crystal grain boundaries or dislocation arrays are divided.

With reference to FIG. 16, in the step of removing circumferential edge portion 7, circumferential edge portion 7 may be removed such that whole of crystal grain boundaries or dislocation arrays in first main surface 11d of silicon carbide semiconductor substrate 11 remains in first main surface 11d. The outer circumferential end portion of silicon carbide single crystal substrate 11 after removing circumferential edge portion 7 becomes outer circumferential end portion 10c1 indicated by a solid line. In this case, circumferential edge portion 7 of silicon carbide single crystal substrate 11 is removed such that in crystal defects 5 such as crystal grain boundaries or dislocation arrays, outer circumferential end portion 10c1 of silicon carbide single crystal substrate 11 after removing circumferential edge portion 7 is located at an outer circumference side relative to portion 5b farthest away from first center 11c of silicon carbide single crystal substrate 11.

Figure 17:
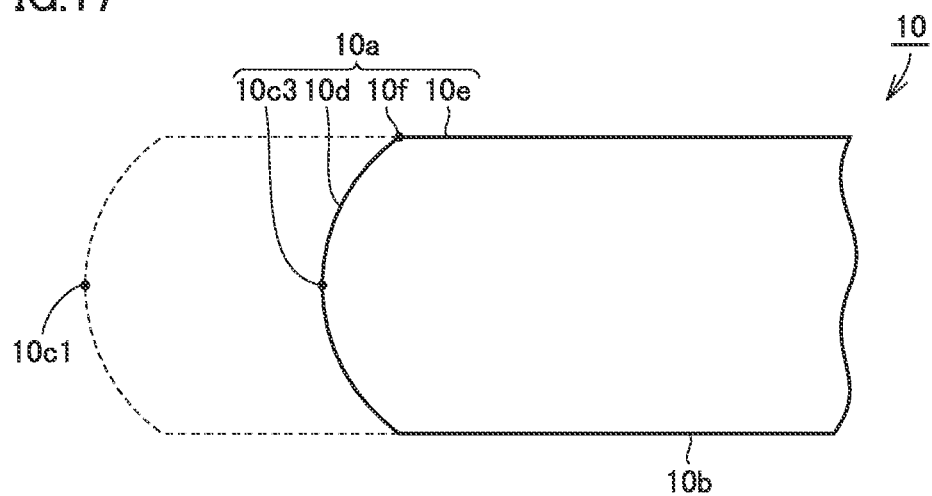
FIG. 17 is a partial schematic enlarged cross sectional view for schematically illustrating the seventh step of the method for manufacturing the silicon carbide semiconductor substrate according to the one embodiment of the present invention.

With reference to FIG. 17, an additional chamfer process is performed. Specifically, circumferential edge portion 7 of silicon carbide single crystal substrate 11 is removed to remove whole of crystal defects 5. The outer circumferential end portion of silicon carbide single crystal substrate 11 after removing circumferential edge portion 7 again becomes outer circumferential end portion 10c3. Likewise, when a dislocation portion exists in circumferential edge portion 7 of silicon carbide single crystal substrate 11, the dislocation portion is chamfered, thereby removing the dislocation portion. Accordingly, silicon carbide semiconductor substrate 10 can be suppressed effectively from being cracked. It should be noted that the additional chamfer process may be performed before silicon carbide epitaxial layer 12 is formed on first main surface 11d of silicon carbide single crystal substrate 11, or may be performed after silicon carbide epitaxial layer 12 is formed. When circumferential edge portion 7 is removed by the addition chamfer process, circumferential edge portion 7 is removed by polishing or grinding circumferential edge portion 7 using a grindstone, a hard rubber, or the like, for example. In the manner described above, silicon carbide semiconductor substrate 10 (FIG. 1) is formed. Silicon carbide semiconductor substrate 10 may be a substrate for a silicon carbide semiconductor device, or may be a seed crystal for growing a silicon carbide single crystal in the sublimation method.

Next, silicon carbide epitaxial layer 12 may be formed on silicon carbide single crystal substrate 11. The silicon carbide epitaxial layer is formed, for example, by CVD (Chemical Vapor Deposition). Specifically, silicon carbide single crystal substrate 11 is supplied with a carrier gas including hydrogen ($H_2$) and a source material gas including mono silane ($SiH_4$), propane ($C_3H_8$), nitrogen ($N_2$), and the like, and then silicon carbide single crystal substrate 11 is heated at about not less than 1500° C. and not more than 1700° C., for example. Accordingly, there is obtained silicon carbide semiconductor substrate 10 having silicon carbide epitaxial layer 12 formed on silicon carbide single crystal substrate 11.

Next, the following describes function and effect of the silicon carbide semiconductor substrate according to the present embodiment.

Silicon carbide semiconductor substrate 10 according to the present embodiment has first main surface 10a and second main surface 10b opposite to first main surface 10a. The maximum diameter of first main surface 10a is larger than 100 mm, and the thickness of silicon carbide semiconductor substrate 10 is not more than 700 µm. In outer circumferential region OR within 5 mm from outer circumferential end portion 10c of first main surface 10a toward center O of first main surface 10a, the dislocation density is not more than 500/$mm^2$ at the arbitrary region having an area of 1 $mm^2$. Accordingly, the silicon carbide semiconductor substrate can be suppressed from being cracked. As a result, silicon carbide semiconductor elements can be manufactured using the silicon carbide semiconductor substrate at an industrially adequate yield.

Moreover, according to silicon carbide semiconductor substrate 10 according to the present embodiment, when at least either of one or more crystal grain boundaries and one or more dislocation arrays exist in a second outer circumferential region OR2 of 1 mm from outer circumferential end portion 10c of first main surface 10a toward the center of first main surface 10a, the dislocation density is not more than 200/mm$^2$ at the arbitrary region having an area of 1 mm$^2$ in outer circumferential region OR within 5 mm from outer circumferential end portion 10c of first main surface 10a toward center O of first main surface 10a. When neither of the crystal grain boundaries and the dislocation arrays exist in second outer circumferential region OR2 of 1 mm from outer circumferential end portion 10c of first main surface 10a toward center O of first main surface 10a, the dislocation density is not more than 500/mm$^2$ at the arbitrary region having an area of 1 mm$^2$ in circumferential region OR within 5 mm from outer circumferential end portion 10c of first main surface 10a toward center O of first main surface 10a.

With more detailed research, it was found that in the case where at least either of one or more crystal grain boundaries and one or more dislocation arrays exist in second outer circumferential region OR2 of 1 mm from outer circumferential end portion 10c of first main surface 10a toward center O of first main surface 10a, silicon carbide semiconductor substrate 10 is more likely to be cracked as compared with a case where neither of the crystal grain boundaries and the dislocation arrays exist in second outer circumferential region OR2. Hence, when at least either of one or more crystal grain boundaries and one or more dislocation arrays exist in second outer circumferential region OR2 of 1 mm from outer circumferential end portion 10c of first main surface 10a toward center O of first main surface 10a, cracks can be suppressed effectively in the silicon carbide semiconductor substrate by providing a dislocation density of not more than 200/mm$^2$ at an arbitrary region having an area of 1 mm$^2$ in outer circumferential region OR within 5 mm from outer circumferential end portion 10c of first main surface 10a toward center O of first main surface 10a.

Furthermore, according to silicon carbide semiconductor substrate 10 according to the present embodiment, the dislocation density is not more than 200/mm$^2$ at the arbitrary region having an area of 1 mm$^2$ in outer circumferential region OR within 5 mm from outer circumferential end portion 10c of first main surface 10a toward center O of first main surface 10a. Accordingly, the silicon carbide semiconductor substrate can be suppressed effectively from being cracked.

Furthermore, according to silicon carbide semiconductor substrate 10 according to the present embodiment, when at least either of one or more crystal grain boundaries and one or more dislocation arrays exist in a second outer circumferential region OR2 of 1 mm from outer circumferential end portion 10c of first main surface 10a toward center O of first main surface 10a, the dislocation density is not more than 100/mm$^2$ at the arbitrary region having an area of 1 mm$^2$ in outer circumferential region OR within 5 mm from outer circumferential end portion 10c of first main surface 10a toward center O of first main surface 10a. When neither of the crystal grain boundaries and the dislocation arrays exist in second outer circumferential region OR2 of 1 mm from outer circumferential end portion 10c of first main surface 10a toward center O of first main surface 10a, the dislocation density is not more than 200/mm$^2$ at the arbitrary region having an area of 1 mm$^2$ in outer circumferential region OR within 5 mm from outer circumferential end portion 10c of first main surface 10a toward center O of first main surface 10a. Accordingly, the silicon carbide semiconductor substrate can be suppressed more effectively from being cracked.

Furthermore, according to silicon carbide semiconductor substrate 10 according to the present embodiment, the dislocation density is not more than 500/mm$^2$ at an arbitrary region having an area of 1 mm$^2$ in an outer circumferential region OR within 10 mm from outer circumferential end portion 10c of first main surface 10a toward center O of first main surface 10a. Accordingly, the silicon carbide semiconductor substrate can be suppressed effectively from being cracked.

Furthermore, according to silicon carbide semiconductor substrate 10 according to the present embodiment, when at least either of one or more crystal grain boundaries and one or more dislocation arrays exist in a second outer circumferential region OR2 of 1 mm from outer circumferential end portion 10c of first main surface 10a toward center O of first main surface 10a, the dislocation density is not more than 200/mm$^2$ at the arbitrary region having an area of 1 mm$^2$ in outer circumferential region OR within 10 mm from outer circumferential end portion 10c of first main surface 10a toward center O of first main surface 10a. When neither of the crystal grain boundaries and the dislocation arrays exist in second outer circumferential region OR2 of 1 mm from outer circumferential end portion 10c of first main surface 10a toward center O of first main surface 10a, the dislocation density is not more than 500/mm$^2$ at the arbitrary region having an area of 1 mm$^2$ in outer circumferential region OR within 10 mm from outer circumferential end portion 10c of first main surface 10a toward center O of first main surface 10a.

With more detailed research, it was found that when at least either of one or more crystal grain boundaries and one or more dislocation arrays exist in second outer circumferential region OR2 of 1 mm from outer circumferential end portion 10c of first main surface 10a toward center O of first main surface 10a, the silicon carbide semiconductor substrate is more likely to be cracked as compared with a case where neither of the crystal grain boundaries and the dislocation arrays exist in second outer circumferential region OR2. Hence, when at least either of one or more crystal grain boundaries and one or more dislocation arrays exist in second outer circumferential region OR2 of 1 mm from outer circumferential end portion 10c of first main surface 10a toward center O of first main surface 10a, cracks can be suppressed effectively in the silicon carbide semiconductor substrate by providing a dislocation density of not more than 200/mm$^2$ at an arbitrary region having an area of 1 mm$^2$ in outer circumferential region OR within 10 mm from outer circumferential end portion 10c of first main surface 10a toward center O of first main surface 10a.

Furthermore, according to silicon carbide semiconductor substrate 10 according to the present embodiment, the dislocation density is not more than 200/mm$^2$ at the arbitrary region having an area of 1 mm$^2$ in outer circumferential region OR within 10 mm from outer circumferential end portion 10c of first main surface 10a toward center O of first main surface 10a. Accordingly, the silicon carbide semiconductor substrate can be suppressed more effectively from being cracked.

Furthermore, according to silicon carbide semiconductor substrate 10 according to the present embodiment, when at least either of one or more crystal grain boundaries and one or more dislocation arrays exist in a second outer circumferential region OR2 of 1 mm from outer circumferential end portion 10c of first main surface 10a toward center O of first main surface 10a, the dislocation density is not more than 100/mm² at the arbitrary region having an area of 1 mm² in outer circumferential region OR within 10 mm from outer circumferential end portion 10c of first main surface 10a toward center O of first main surface 10a. When neither of the crystal grain boundaries and the dislocation arrays exist in second outer circumferential region OR2 of 1 mm from outer circumferential end portion 10c of first main surface 10a toward center O of first main surface 10a, the dislocation density is not more than 200/mm² at the arbitrary region having an area of 1 mm² in outer circumferential region OR within 10 mm from outer circumferential end portion 10c of first main surface 10a toward center O of first main surface 10a. Accordingly, the silicon carbide semiconductor substrate can be suppressed more effectively from being cracked.

Furthermore, according to silicon carbide semiconductor substrate 10 according to the present embodiment, silicon carbide semiconductor substrate 10 includes: a silicon carbide single crystal substrate 11 that constitutes second main surface 10b; and a silicon carbide epitaxial layer 12 that is provided on silicon carbide single crystal substrate 11 and that constitutes first main surface 10a. Accordingly, the silicon carbide semiconductor substrate having the silicon carbide epitaxial layer can be suppressed from being cracked.

Furthermore, according to silicon carbide semiconductor substrate 10 according to the present embodiment, the maximum diameter of first main surface 10a is not less than 150 mm. The silicon carbide semiconductor substrate is more likely to be cracked as the maximum diameter of the first main surface becomes larger. It is possible to particularly effectively suppress cracks in the large-diameter silicon carbide semiconductor substrate with the first main surface having a maximum diameter of not less than 150 mm.

Furthermore, according to silicon carbide semiconductor substrate 10 according to the present embodiment, the thickness of silicon carbide semiconductor substrate 10 is not more than 600 μm. A silicon carbide semiconductor is more likely to be cracked when the silicon carbide semiconductor has a larger diameter and a thinner thickness. The silicon carbide semiconductor substrate having a large diameter and a thin thickness of not more than 600 μm can be particularly effectively suppressed from being cracked.

According to the method for manufacturing silicon carbide semiconductor substrate 10 according to the present embodiment, in the step of removing circumferential edge portion 7, circumferential edge portion 7 is removed such that the position of first center 11c of first main surface 11d of silicon carbide semiconductor substrate 11 before removing circumferential edge portion 7 does not match with the position of second center O of first main surface 11d of silicon carbide semiconductor substrate 11 after removing circumferential edge portion 7, and such that second center O is located in first main surface 11d at first region 11a within 15° from the straight line obtained by projecting, on the first main surface, the straight line passing through first center 11c and parallel to the <1-100> direction when viewed from first center 11c. Stacking faults are generated more frequently in the <1-100> direction as compared with those in the <11-20> direction. Hence, the stacking faults can be effectively removed by removing circumferential edge portion 7 such that the position of first center 11c of first main surface 11d of silicon carbide semiconductor substrate 11 before removing circumferential edge portion 7 does not match with the position of second center O of first main surface 11d of silicon carbide semiconductor substrate 11 after removing circumferential edge portion 7, and such that second center O is located in first main surface 11d at first region 11a within 15° relative to the straight line obtained by projecting, on the first main surface, the straight line passing through first center 11c and parallel to the <1-100> direction when viewed from first center 11c. As a result, the silicon carbide semiconductor substrate can be suppressed from being cracked.

Moreover, the method for manufacturing silicon carbide semiconductor substrate 10 further includes a step of specifying a region 6 having a stacking fault by observing first main surface 11d of silicon carbide semiconductor substrate 11, after the step of preparing silicon carbide semiconductor substrate 11 and before the step of removing circumferential edge portion 7 of silicon carbide semiconductor substrate 11. In the step of removing circumferential edge portion 7, region 6 having the stacking fault is removed. Accordingly, the stacking fault can be removed more effectively.

Furthermore, according to the method for manufacturing silicon carbide semiconductor substrate 10, in the step of preparing silicon carbide semiconductor substrate 11, at least either of one or more crystal grain boundaries and one or more dislocation arrays may exist in first main surface 11d of silicon carbide semiconductor substrate 11. In the step of removing circumferential edge portion 7, circumferential edge portion 7 is removed not to remove either of the crystal grain boundaries and the dislocation arrays. Accordingly, a ratio of generation of cracks can be reduced in the silicon carbide semiconductor substrate.

Furthermore, according to the method for manufacturing silicon carbide semiconductor substrate 10, in the step of removing circumferential edge portion 7, circumferential edge portion 7 is removed to remove whole of the crystal grain boundaries or the dislocation arrays in first main surface 11d of silicon carbide semiconductor substrate 11. Accordingly, a ratio of generation of cracks can be effectively reduced in the silicon carbide semiconductor substrate.

Furthermore, according to the method for manufacturing silicon carbide semiconductor substrate 10, in the step of removing circumferential edge portion 7, circumferential edge portion 7 is removed such that whole of the crystal grain boundaries or the dislocation arrays in first main surface 11d of silicon carbide semiconductor substrate 11 remains in first main surface 11d. Accordingly, a ratio of generation of cracks can be effectively reduced in the silicon carbide semiconductor substrate.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide single crystal; 1a: single-crystal substrate; 2: seed crystal; 2a: third main surface; 2b: fourth main surface; 3: silicon carbide source material; 5: crystal defect; 6: region; 7: circumferential edge portion; 10: silicon carbide semiconductor substrate; 10a: first main surface; 10b: second main surface; 10c, 10c1, 10c2, 10c3: outer circumferential end portion; 10d: chamfered portion; 10e: flat portion; 10f: boundary portion; 10g: side end portion; 11: silicon carbide single crystal substrate; 11a: first region; 11b: second region; 11c: first center; 11d: first main surface; 11e: second main surface; 11p: outer circumferential end portion; 12: silicon carbide epitaxial layer; 20: crucible; 21: seed crystal holding portion; 22: source material accommodating portion; D, D1, D2, D3; D4: maximum diameter; G: center of gravity; IR: inner circumferential region; L: removal amount; O: center (second center); OR: outer circumferential region; OR1: first outer circumferential region; OR2: second outer circumferential region; T: thickness; a, b: length; r1: first straight line; r2: second straight line; x1, x2: distance.

The invention claimed is:

1. A silicon carbide semiconductor substrate comprising a first main surface and a second main surface opposite to the first main surface,
    the first main surface having a maximum diameter of more than 100 mm, the silicon carbide semiconductor substrate having a thickness of not more than 700 μm,
    a dislocation density being not more than 500/mm$^2$ at an arbitrary region having an area of 1 mm$^2$ in a region within 5 mm from an outer circumferential end portion of the first main surface toward a center of the first main surface,
    wherein the region has a chamfered portion,
    wherein one or more crystal defects exist in the first main surface,
    wherein a ratio obtained by dividing a length of the one or more crystal defects in a long side direction by a length of the one or more crystal defects in a short side direction is not less than 2,
    when a first straight line represents a straight line passing through a part of the one or more crystal defects at an outermost circumference side of the first main surface and the center of the first main surface, and a second straight line represents a straight line in the long side direction of the one or more crystal defects,
    an angle formed by the first straight line and the second straight line is more than 45° and is not more than 90°.

2. The silicon carbide semiconductor substrate according to claim 1, wherein when at least either of one or more crystal grain boundaries and one or more dislocation arrays exist in a region of 1 mm from the outer circumferential end portion of the first main surface toward the center of the first main surface, the dislocation density is not more than 200/mm$^2$ at the arbitrary region having an area of 1 mm$^2$ in the region within 5 mm from the outer circumferential end portion of the first main surface toward the center of the first main surface, and
    when neither of the crystal grain boundaries and the dislocation arrays exist in the region of 1 mm from the outer circumferential end portion of the first main surface toward the center of the first main surface, the dislocation density is not more than 500/mm$^2$ at the arbitrary region having an area of 1 mm$^2$ in the region within 5 mm from the outer circumferential end portion of the first main surface toward the center of the first main surface.

3. The silicon carbide semiconductor substrate according to claim 1, wherein the dislocation density is not more than 200/mm$^2$ at the arbitrary region having an area of 1 mm$^2$ in the region within 5 mm from the outer circumferential end portion of the first main surface toward the center of the first main surface.

4. The silicon carbide semiconductor substrate according to claim 3, wherein
    when at least either of one or more crystal grain boundaries and one or more dislocation arrays exist in a region of 1 mm from the outer circumferential end portion of the first main surface toward the center of the first main surface, the dislocation density is not more than 100/mm$^2$ at the arbitrary region having an area of 1 mm$^2$ in the region within 5 mm from the outer circumferential end portion of the first main surface toward the center of the first main surface, and
    when neither of the crystal grain boundaries and the dislocation arrays exist in the region of 1 mm from the outer circumferential end portion of the first main surface toward the center of the first main surface, the dislocation density is not more than 200/mm$^2$ at the arbitrary region having an area of 1 mm$^2$ in the region within 5 mm from the outer circumferential end portion of the first main surface toward the center of the first main surface.

5. The silicon carbide semiconductor substrate according to claim 1, wherein the dislocation density is not more than 500/mm$^2$ at an arbitrary region having an area of 1 mm$^2$ in a region within 10 mm from the outer circumferential end portion of the first main surface toward the center of the first main surface.

6. The silicon carbide semiconductor substrate according to claim 5, wherein
    when at least either of one or more crystal grain boundaries and one or more dislocation arrays exist in a region of 1 mm from the outer circumferential end portion of the first main surface toward the center of the first main surface, the dislocation density is not more than 200/mm$^2$ at the arbitrary region having an area of 1 mm$^2$ in the region within 10 mm from the outer circumferential end portion of the first main surface toward the center of the first main surface, and
    when neither of the crystal grain boundaries and the dislocation arrays exist in the region of 1 mm from the outer circumferential end portion of the first main surface toward the center of the first main surface, the dislocation density is not more than 500/mm$^2$ at the arbitrary region having an area of 1 mm$^2$ in the region within 10 mm from the outer circumferential end portion of the first main surface toward the center of the first main surface.

7. The silicon carbide semiconductor substrate according to claim 5, wherein the dislocation density is not more than 200/mm$^2$ at the arbitrary region having an area of 1 mm$^2$ in the region within 10 mm from the outer circumferential end portion of the first main surface toward the center of the first main surface.

8. The silicon carbide semiconductor substrate according to claim 7, wherein
    when at least either of one or more crystal grain boundaries and one or more dislocation arrays exist in a region of 1 mm from the outer circumferential end portion of the first main surface toward the center of the first main surface, the dislocation density is not more than 100/mm$^2$ at the arbitrary region having an area of 1 mm$^2$ in the region within 10 mm from the outer circumferential end portion of the first main surface toward the center of the first main surface, and
    when neither of the crystal grain boundaries and the dislocation arrays exist in the region of 1 mm from the outer circumferential end portion of the first main surface toward the center of the first main surface, the dislocation density is not more than 200/mm$^2$ at the arbitrary region having an area of 1 mm$^2$ in the region within 10 mm from the outer circumferential end portion of the first main surface toward the center of the first main surface.

9. The silicon carbide semiconductor substrate according to claim 1, wherein the silicon carbide semiconductor substrate includes: a silicon carbide single crystal substrate that constitutes the second main surface; and a silicon carbide epitaxial layer that is provided on the silicon carbide single crystal substrate and that constitutes the first main surface.

10. The silicon carbide semiconductor substrate according to claim 1, wherein the maximum diameter of the first main surface is not less than 150 mm.

11. The silicon carbide semiconductor substrate according to claim 1, wherein the thickness of the silicon carbide semiconductor substrate is not more than 600 μm.

12. A silicon carbide semiconductor substrate comprising a first main surface and a second main surface opposite to the first main surface,
the first main surface having a maximum diameter of more than 100 mm, the silicon carbide semiconductor substrate having a thickness of not more than 700 μm,
wherein one or more crystal defects exist in a region of 1 mm from an outer circumferential end portion of the first main surface toward a center of the first main surface,
the one or more crystal defects include one or more crystal grain boundaries,
a dislocation density being not more than 200/mm$^2$ at an arbitrary region having an area of 1 mm$^2$ in a region within 5 mm from the outer circumferential end portion of the first main surface toward the center of the first main surface,
wherein a ratio obtained by dividing a length of the one or more crystal defects in a long side direction by a length of the one or more crystal defects in a short side direction is not less than 2,
when a first straight line represents a straight line passing through a part of the one or more crystal defects at an outermost circumference side of the first main surface and the center of the first main surface, and a second straight line represents a straight line in the long side direction of the one or more crystal defects,
an angle formed by the first straight line and the second straight line is more than 45° and is not more than 90°.

13. The silicon carbide semiconductor substrate according to claim 12,
wherein the dislocation density is not more than 100/mm$^2$ at the arbitrary region having an area of 1 mm$^2$ in the region within 5 mm from the outer circumferential end portion of the first main surface toward the center of the first main surface.

14. The silicon carbide semiconductor substrate according to claim 12,
wherein the dislocation density is not more than 200/mm$^2$ at the arbitrary region having an area of 1 mm$^2$ in the region within 10 mm from the outer circumferential end portion of the first main surface toward the center of the first main surface.

15. The silicon carbide semiconductor substrate according to claim 14, wherein the dislocation density is not more than 100/mm$^2$ at the arbitrary region having an area of 1 mm$^2$ in the region within 10 mm from the outer circumferential end portion of the first main surface toward the center of the first main surface.

16. The silicon carbide semiconductor substrate according to claim 12,
wherein the silicon carbide semiconductor substrate includes: a silicon carbide single crystal substrate that constitutes the second main surface; and a silicon carbide epitaxial layer that is provided on the silicon carbide single crystal substrate and that constitutes the first main surface.

17. The silicon carbide semiconductor substrate according to claim 12,
wherein the maximum diameter of the first main surface is not less than 150 mm.

18. The silicon carbide semiconductor substrate according to claim 12,
wherein the thickness of the silicon carbide semiconductor substrate is not more than 600 μm.

* * * * *